United States Patent
Yu et al.

(10) Patent No.: US 10,103,303 B2
(45) Date of Patent: Oct. 16, 2018

(54) LIGHT EMITTING PACKAGE

(71) Applicant: LG INNOTEK CO., LTD., Seoul (KR)

(72) Inventors: Dong Hyun Yu, Seoul (KR); Choong Youl Kim, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 0 days.

(21) Appl. No.: 15/361,149

(22) Filed: Nov. 25, 2016

(65) Prior Publication Data
US 2017/0155024 A1    Jun. 1, 2017

(30) Foreign Application Priority Data

Nov. 27, 2015  (KR) .................. 10-2015-0167641

(51) Int. Cl.
*H01L 33/62* (2010.01)
*H01L 33/48* (2010.01)

(52) U.S. Cl.
CPC ............ *H01L 33/62* (2013.01); *H01L 33/486* (2013.01); *H01L 2224/48091* (2013.01); *H01L 2224/48247* (2013.01); *H01L 2224/48257* (2013.01); *H01L 2933/0033* (2013.01); *H01L 2933/0066* (2013.01)

(58) Field of Classification Search
CPC ........... H01L 33/62; H01L 2224/48091; H01L 2224/48247
See application file for complete search history.

(56) References Cited

U.S. PATENT DOCUMENTS 8,610,156 B2 * 12/2013 Kim .................. H01L 33/483
                                                                257/690
2008/0038853 A1    2/2008 Park et al.
2013/0277706 A1   10/2013 Chen et al.
2015/0340568 A1   11/2015 Hsieh et al.

FOREIGN PATENT DOCUMENTS

EP          2 330 646 A2   6/2011
EP          2 947 705 A1  11/2015
KR   10-2012-0069290 A     6/2012

* cited by examiner

*Primary Examiner* — Errol Fernandes
(74) *Attorney, Agent, or Firm* — Birch, Stewart, Kolasch & Birch, LLP

(57) ABSTRACT

A light emitting package includes a first lead frame; a second lead frame spaced apart from the first lead frame in a first direction; a body coupled to the first lead frame and the second lead frame; and a light emitting element on the first lead frame. The first lead frame includes first to fourth side parts, the first side part includes a first protrusion that protrudes outwards from one side surface of the body, and a first contact part disposed at the end of the first protrusion. The second lead frame includes fifth to eighth side parts, the fifth side part includes a second protrusion that protrudes outwards from a side surface of the body, which is symmetrical to the one side surface of the body, and a second contact part disposed at the end of the second protrusion. Each of the first contact part and the second contact part includes a second layer and first layer covers the second layer.

20 Claims, 10 Drawing Sheets

LIGHT EMITTING PACKAGE

CROSS-REFERENCE TO RELATED APPLICATIONS

The application claims priority under 35 U.S.C. § 119 and 35 U.S.C. § 365 to Korean Patent Application No. 10-2015-0167641, filed in Korea on Nov. 27, 2015, whose entire disclosure is hereby incorporated by reference.

BACKGROUND

The present disclosure relates to a light emitting package and a lighting device.

A light emitting device is a kind of a semiconductor device that converts electrical energy to light, and is spotlighted as a next-generation light source that replaces existing fluorescent lights and white bulbs.

As the light emitting diode generates light by using a semiconductor device, and consumes very low power as compared with a light bulb that generates light by heating tungsten or a fluorescent light that generates light when ultraviolet rays generated through a high voltage discharge collide with a fluorescent body.

Further, as the light diode generates light by using a potential gap of a semiconductor element, it has a long life span, has prompt response characteristics, and environment-friendly characteristics as compared with an existing light source.

Accordingly, many studies for replacing an existing light source by a light emitting diode have been made, and the light emitting diodes have been increasingly used as a light source of lighting devices, such as various lamps, a liquid crystal display device, an electronic display, or a streetlamp.

SUMMARY

Embodiments provide a light emitting package having an improved electrical characteristic inspection reliability and a lighting device.

Embodiments provide a light emitting package that includes a lead frame for improving corrosion by oxidation and a lighting device.

In accordance with an aspect of the present disclosure, there is provided a light emitting package including a first lead frame; a second lead frame spaced apart from the first lead frame in a first direction; a body coupled to the first and second lead frames; and a light emitting element on the first lead frame, wherein the first lead frame includes first to fourth side parts, the first side part includes a first protrusion that protrudes outwards from one side surface of the body, and a first contact part disposed at the end of the first protrusion, wherein the second lead frame includes fifth to eighth side parts, the fifth side part includes a second protrusion that protrudes outwards from a side surface of the body, and a second contact part disposed at the end of the second protrusion, and wherein each of the first contact part and second contact part includes first layer that covers second layer.

A lighting device of the embodiment may include the light emitting package.

DETAILED DESCRIPTION OF THE EMBODIMENTS

Embodiments of the present disclosure may be modified into other forms or may be combined with each other, and the scope of the present disclosure is not limited to the embodiments, which will be described below.

Although contents that have been described in a specific embodiment are not described in other embodiments, they may be construed as the contents also related to the other embodiments unless the other embodiments make opposite or contradictory descriptions.

For example, if a specific embodiment describes a feature of element A and another embodiment describes a feature of element B, they also fall within the scope of the present disclosure unless they are opposite to each other or contradictory even if an embodiment in which element A and element B are combined is not explicitly described.

Hereinafter, exemplary embodiments of the present disclosure for realizing the objects will be described with reference to the accompanying drawings.

In a detailed description of the embodiments of the present disclosure, when it is described that a first element is formed on or under a second element, it is understood that the two elements may directly contact each other or one or more elements are arranged between the two elements. Further, on or under may mean that an element may be arranged under another element as well as on the second element.

A semiconductor element may include various electronic elements, including a light emitting element and a light receiving element, and both the light emitting element and the light receiving element may include a first conductive type semiconductor layer and a second conductive type semiconductor layer.

The semiconductor element according to the present embodiment may be a light emitting element.

The light emitting element emits light as electrons and holes are recoupled to each other, and the wavelength of the light is determined by a natural energy band gap of a material. Accordingly, the emitting light may be different according to the composition of the material.

Figure 1:
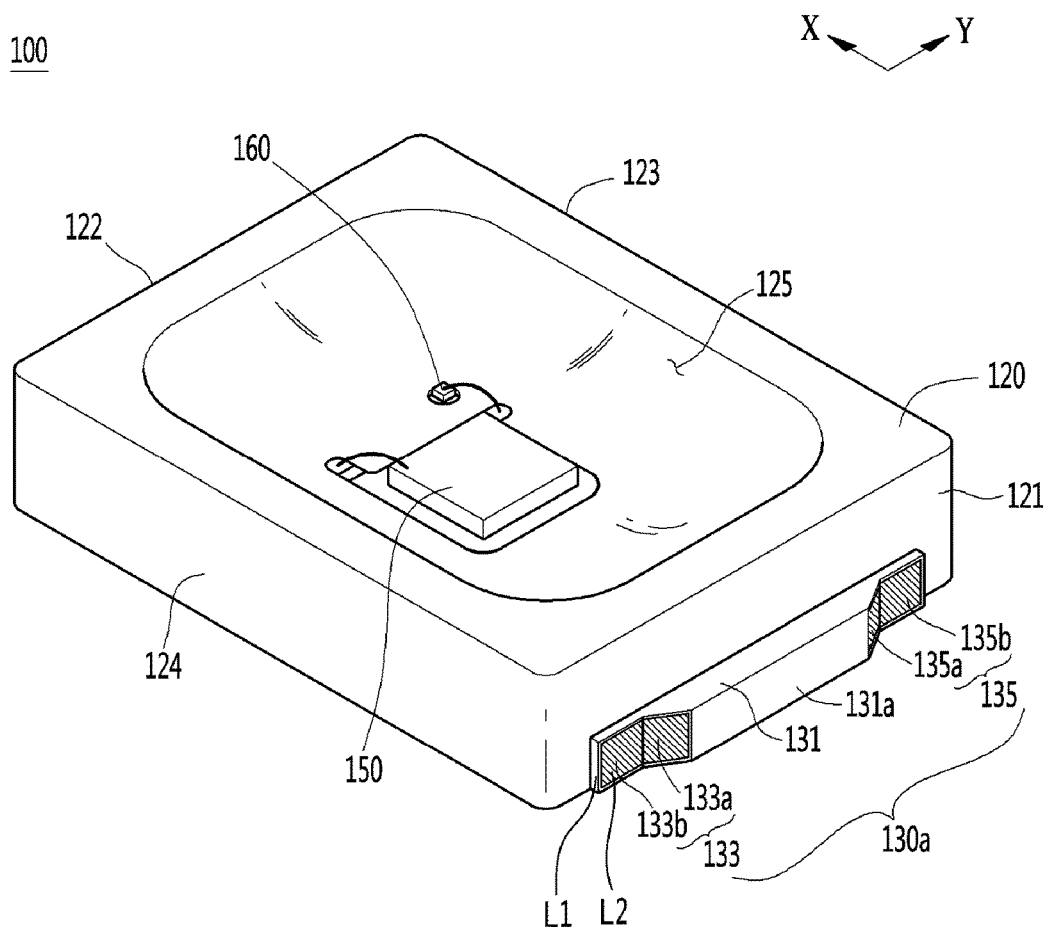
FIG. 1 is a perspective view illustrating a light emitting package according to an embodiment.
Figure 2:
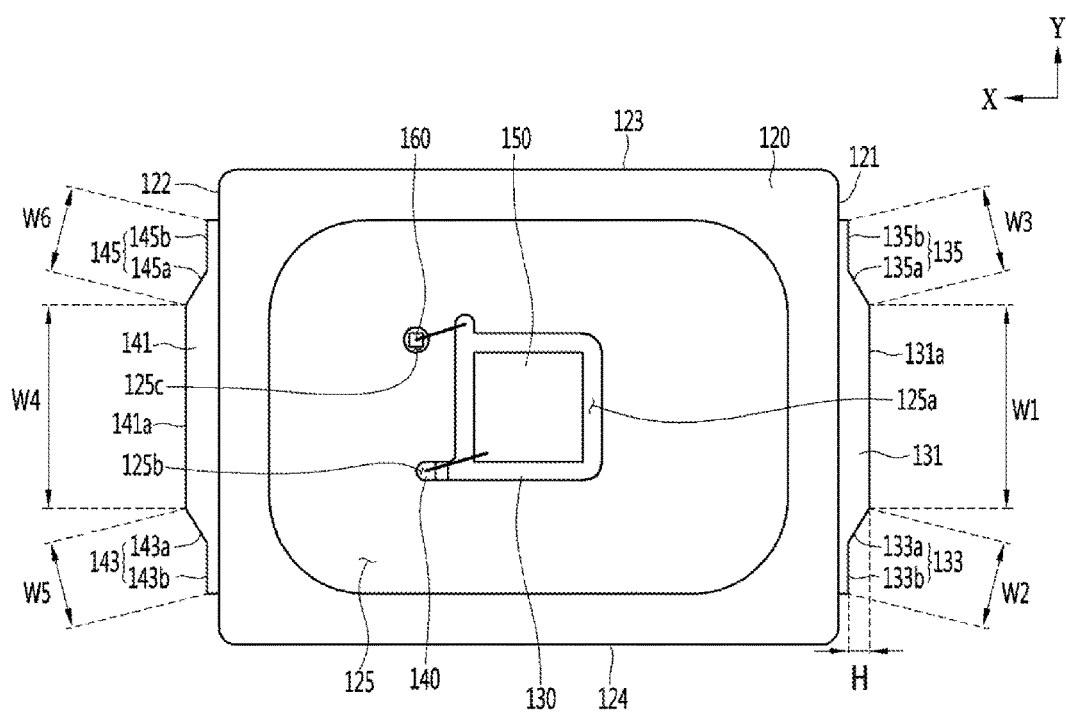
FIG. 2 is a plan view illustrating a light emitting package according to an embodiment.
Figure 3:
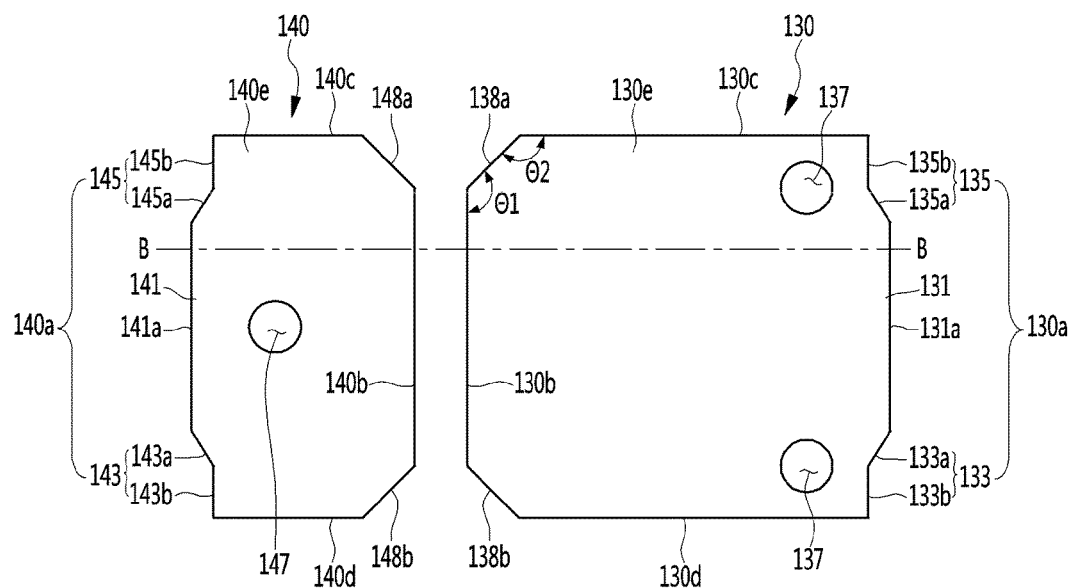
FIG. 3 is a plan view illustrating first and second lead frames according to an embodiment.
Figure 4:
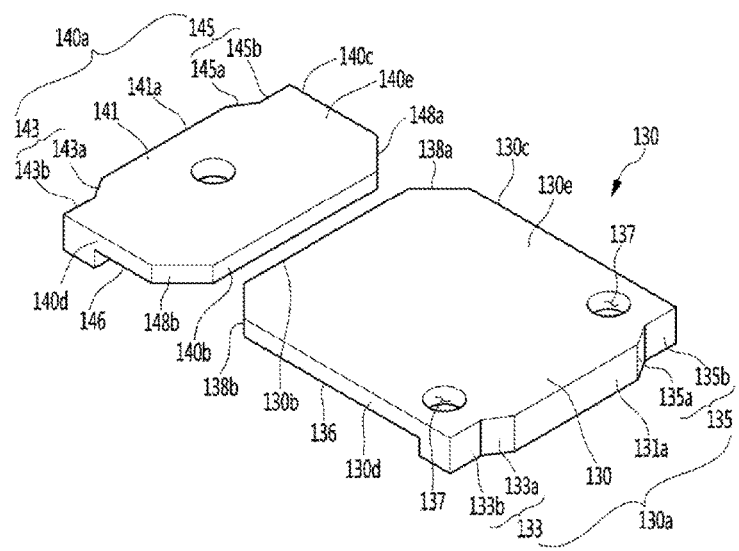
FIG. 4 is a perspective view illustrating first and second lead frames according to an embodiment.

FIG. 1 is a perspective view illustrating a light emitting package according to an embodiment. FIG. 2 is a plan view illustrating a light emitting package according to an embodiment. FIG. 3 is a plan view illustrating first and second lead frames according to an embodiment. FIG. 4 is a perspective view illustrating first and second lead frames according to an embodiment.

As illustrated in FIGS. 1 to 4, the light emitting package 100 according to an embodiment may include a first lead frame 130, a second lead frame 140, a body 120, a protective element 160, and a light emitting element 150.

The light emitting element 150 may be arranged on the first lead frame 130. The light emitting element 150 may be arranged on an upper surface of the first lead frame 130, which is exposed from the body 120. It has been described that one light emitting element 150 is provided in the embodiment, but the present disclosure is not limited thereto and may include two or more light emitting elements to provide an array form. The light emitting element 150 may be connected through a wire, but the present disclosure is not limited thereto. The light emitting element 150 may be arranged at a central portion of the body 120, but the present disclosure is not limited thereto.

The protective element 160 may be arranged on the second lead frame 140. The protective element 160 may be arranged on an upper surface of the second lead frame 180, which is exposed to the body 120. The protective element 160 may be a Zener diode, a thyristor, a transient voltage suppression (TVS), or the like, but the present disclosure is not limited thereto. It will be described as an example that the protective element 160 of the embodiment is a Zener diode that protects the light emitting element 150 form electro static discharge (ESD). The protective element 160 may be connected to the first lead frame 130 through a wire.

The body 120 may include at least one of a translucent material, a reflective material, and an insulating material. The body 120 may include a material of a transmissivity that is higher than the reflectivity thereof, for light emitted from the light emitting element 150. The body 120 may be formed of a resin based insulating material. For example, the body 120 may be formed of at least one of a resin such as polyphthalamide (PPA) or epoxy, silicon, a metal, photo sensitive glass, sapphire ($Al_2O_3$), and a printed circuit board (PCB). The body 120 may include an outer surface having a specific curvature or an outer surface having an angled surface. The top view of the body 120, for example, may have a circular or polygonal shape. It will be described as an example that the body 120 of the embodiment has a polygonal shape including first to fourth outer surfaces 121 to 124.

The body 120 may be coupled to the first and second lead frames 130 and 140. The body 120 may include a cavity 125 that exposes portions of upper surfaces of the first and second lead frames 130 and 140.

The cavity 125 may include a first bottom surface 125a that exposes the first lead frame 130, and second and third bottom surfaces 125b and 125c that expose the second lead frame 140. The first bottom surface 125a is an area in which the light emitting element 150 is mounted, and may correspond to the shape of the light emitting element 150. The first bottom surface 125a may further include an area to which a wire of the protective element 160 is connected. Corners of the first bottom surface 125a may have a specific curvature. The corners of the first bottom surface 125a, which has the specific curvature, may improve optical efficiency by constantly maintaining a gap between the light emitting element 150 and an inner surface of the cavity 125. The second bottom surface 125b is an area in which a wire of the light emitting element 150 is connected to the second lead frame 140, and may be arranged in an area that is adjacent to the first lead frame 130. The third bottom surface 125c is an area in which the protective element 160 is mounted and may be spaced apart from the second bottom surface 125b by a specific gap, but the present disclosure is not limited thereto.

The body 120 may include first to fourth outer surfaces 121 to 124, and the top view of the body 120 may have a rectangular shape. The first and second outer surfaces 121 and 122 may be arranged in parallel in a first direction X. In the embodiment, portions of the first and second lead frames 130 and 140 may be exposed from the first and second outer surfaces 121 and 122. In the embodiment, a first side part 130a of the first lead frame 130 may be exposed from the first outer surface 121. In the embodiment, a fifth side part 140a of the second lead frame 140 may be exposed from the second outer surface 122. The third and fourth outer surfaces 123 and 124 may be arranged in parallel in a second direction Y that is perpendicular to the first direction X In the embodiment, the first and second lead frames 130 and 140 are not exposed from the third and fourth outer surfaces 123 and 124. That is, in the embodiment, the first and second lead frames 130 and 140 may be arranged inside the third and fourth outer surfaces 123 and 124.

The first and second lead frames 130 and 140 may be spaced apart from each other by a specific gap to be coupled to the body 120. The light emitting element 150 may be mounted on the first lead frame 130, and the protective element 160 may be mounted on the second lead frame 140. The first and second lead frames 130 and 140 may be arranged in parallel in the first direction X. The first lead frame 130 may have a width in the first direction X, which is larger than that of the second lead frame 140, but the present disclosure is not limited thereto. The first and second lead frames 130 and 140 may include a conductive material. For example, the first and second lead frames 130 and 140 may include at least one of titanium (Ti), copper (Cu), nickel (Ni), gold (Au), chrome (Cr), tantalum (Ta), platinum (Pt), tin (Sn), silver (Ag), phosphorus (P), iron (Fe), tin (Sn), zinc (Zn), and aluminum (Al), and may have a plurality of layers. The first and second lead frames 130 and 140 of the embodiment may include second layer L2, and first layer L1 that covers the second layer L2. The second layer L2 may be a conductive material that is electrically conductive, heat dissipative, and economical in costs. For example, the second layer L2 may include copper (Cu). The first layer L1 comprises a function to prevent oxidation. The first layer L1 may be a conductive material that is resistant to oxidation and highly reflective. For example, the first layer L1 may include silver (Ag). It has been described in the embodiment that the first and second lead frames 130 and 140 obtained by plating silver (Ag) on a surface of copper (Cu), but the present disclosure is not limited thereto.

The first lead frame 130 may include first to fourth side parts 130a to 130d, and an upper surface 130e on which the light emitting element 150 is mounted. The first to fourth side parts 130a to 130d may be arranged outside the first lead frame 130.

The first side part 130a may correspond to the first side surface 121 of the body 120. The first side part 130a may be exposed from the first side surface 121 of the body 120. The first side part 130a may protrude from the first side surface 121 of the body 120.

The first side part 130a may be exposed from the first side surface 121 of the body 120. The first side part 130a may include a first protrusion 131 that protrudes outwards, and first and second cutaway parts 133 and 135 that are arranged on opposite sides of the first protrusion 131.

The first protrusion 131 may include a first contact part 131a. The first contact part 131a may include a pad function for inputting a driving signal in an inspection process of the light emitting package 100. That is, the first contact part 131a may include an electric contact function for inputting a driving signal in an inspection process. The first protrusion 131 may protrude outwards further than the first and second cutaway parts 133 and 135. The first contact part 131a may be arranged at an end of the first protrusion 131. The first contact part 131a may be arranged on an outer side of the first and second cutaway parts 133 and 135. The first protrusion 131 and the first contact part 131a may be formed of a conductive material that is resistant to oxidation and highly reflective. For example, the first layer L1, for example, including silver (Ag) may be silver-plated on surfaces of the first protrusion 131 and the first contact part 131a, but the present disclosure is not limited thereto. A first width W1 of the first contact part 131a in the second direction Y that is perpendicular to the first direction X may be not less than 300 μm. When the first width W1 of the first contact part 131a is less than 300 μm, an external signal contact defect of the inspect process may be caused.

A general light emitting package may be separated into unit light emitting packages by cutting protrusion areas of the first and second lead frames. A general light emitting package may be configured such that the second layer, for example, including copper (Cu) is exposed through a process of cutting outer surfaces of the first and second lead frames, to which a driving signal is input. A contact resistance of the second layer, for example, including copper (Cu) is higher than that of silver (Ag) or gold (Au), and thus is not suitable for an electrical contact point.

In the embodiment, the first and second cutaway parts 133 and 135, from which cutaway surfaces are exposed through a cutting process may be arranged in an area that deviates from the first contact part 131a of the first protrusion 131, to which a driving signal is input. For example, in the embodiment, the first and second cutaway parts 133 and 135 is configured such that the second layer L2 having a contact resistance that is higher than that of the first layer L1 may be exposed to the outside, through a cutting process. The first and second cutaway parts 133 and 135 may be arranged in an area that deviates from the first contact part 131a of an electrical contact point so that lowering of the electrical characteristics of the first and second cutaway parts 133 and 135 may be restrained.

The first cutaway part 133 may extend from the first protrusion 131 in a direction that is opposite to the second direction Y. The second cutaway part 135 may extend from the first protrusion 131 in the second direction Y. The first and second cutaway parts 133 and 135 may be formed through a process of cutting a metal frame, by which the light emitting package 100 is manufactured. The first and second cutaway parts 133 and 135 may be formed on the first side part 130a of the first lead frame 130 through the cutting process. For example, the first and second cutaway parts 133 and 135 are configured such that the second layer L2 may be exposed from the first layer L1 to the outside. The first and second cutaway parts 133 and 135 may have a structure that is stepped from the first contact part 131a. The height H of the step between the first contact part 131a and the first and second cutaway parts 133 and 135 may be not less than 10 μm. For example, the height H of the step between the first contact part 131a and the first and second cutaway parts 133 and 135 may be 10 μm to 300 μm. When the height H of the step between the first contact part 131a and the first and second cutaway parts 133 and 135 is less than 10 μm, portions of the first and second cutaway parts and a connection part of the inspection process, as well as the first contact part 131a of the first protrusion 131, may contact each other, and accordingly, the reliability of the inspection process may lower. When the height H of the step between the first contact part 131a and the first and second cutaway parts 133 and 135 exceeds 300 μm, an area of the first side part 130a, which is exposed to a side surface of the light emitting package 100, increases, and accordingly, productivity may lower and the design of the product may be restricted as well. The second width W2 of the first cutaway part 133 in the second direction Y may be 100 μm to 500 μm, but the present disclosure is not limited thereto. The third width W3 of the second cutaway part 135 in the second direction Y may be 100 μm to 500 μm, but the present disclosure is not limited thereto. The second and third widths W2 and W3 of the first and second cutaway parts 133 and 135 may be the same, but the present disclosure is not limited thereto.

The first cutaway part 133 may include a first inclined portion 133a that extends from the first contact part 131a, and a first edge portion 133b that extends from the first inclined portion 133a. The first edge portion 133b may be arranged to be closer to an outermost side of the body 120 than to the first contact part 131a. That is, the first contact part 131a may be arranged on an outer side of the first edge portion 133b. The first edge portion 133b may be spaced apart from the first contact part 131a in parallel in the first direction X.

The first inclined portion 133a and the first edge portion 133b may include horizontal widths that are less than the thickness of the first lead frame 130. For example, the first inclined portion 133a and the first edge portion 133b may include horizontal widths of 50 μm to 300 μm. When the horizontal widths of the first inclined portion 133a and the first edge portion 133b are less than 50 μm, it may be difficult to cut a small horizontal width. When the horizontal widths of the first inclined portion 133a and the first edge portion 133b exceed 300 μm, a crack or a deflection may be generated around a cutaway surface in the cutting process due to the horizontal widths of the first inclined portion 133a and the first edge portion 133b, which are larger than the thickness of the first lead frame 130, and the crack or deflection on the cutaway surface lower the quality of the external appearance thereof.

The second cutaway part 135 may include a second inclined portion 135a that extends from the first contact part 131a, and a second edge portion 135b that extends from the second inclined portion 135a. That is, the first contact part 131a may be arranged on an outer side of the second edge portion 135b. The second edge portion 135b may be spaced apart from the first contact part 131a in parallel in the first direction X.

The second inclined portion 135a and the second edge portion 135b may include horizontal widths that are less than the thickness of the first lead frame 130. For example, the second inclined portion 135a and the second edge portion 135b may include horizontal widths of 50 µm to 300 µm. When the horizontal widths of the second inclined portion 135a and the second edge portion 135b are less than 50 µm, it may be difficult to cut a small horizontal width. When the horizontal widths of the second inclined portion 135a and the second edge portion 135b exceed 300 µm, a crack or a deflection may be generated around a cutaway surface in the cutting process due to the horizontal widths of the second inclined portion 135a and the second edge portion 135b, which are larger than the thickness of the first lead frame 130, and the crack or deflection on the cutaway surface lower the quality of the external appearance thereof.

The first and second cutaway parts 133 and 135 may be symmetrical to each other in the second direction Y. The first and second inclined portions 133a and 135a may be symmetrical to each other, and the first and second edge portions 133b and 135b may overlap each other in the second direction Y. The first and second edge portions 133b and 135b may be arranged on the same plane in the second direction Y.

The second side part 130b may be arranged adjacent to the second lead frame 140. The second side part 130b may face a sixth side part 140b of the second lead frame 140. The second side part 130b is not exposed to the outside due to the body 120. The first lead frame 130 may include third and fourth inclined portions 138a and 138b that are symmetrical to each other in the second direction Y, at opposite ends of the second side part 130b. A coupling force of the third and fourth inclined portions 138a and 138b to the body 120 may be improved as a joining area between the body 120 and the first and second lead frames 130 and 140 increases. For example, the body 120 may be coupled to the first and second lead frames 130 and 140 through an injection-molding process. The third and fourth inclined portions 138a and 138b may improve injection flows between the first and second lead frames 130 and 140 in a process of injection-molding the body 120. A first inclination angle θ1 that is defined by the third inclined portion 138a and the second side part 130b may greater than 90° and may be less than 180°. Further, a second inclination angle θ2 that is defined by the third inclined portion 138a and the third side part 130c may greater than 90° and may be less than 180°. The first and second inclination angles θ1 and θ2 may be the same or different.

An inclination angle of the fourth inclined portion 138b may employ the characteristics of the third inclined portion 138a.

The third and fourth side parts 130c and 130d may be symmetrical to each other and may have flat surfaces. The third and fourth side parts 130c and 130d are not exposed to the outside due to the body 120. The third and fourth side parts 130c and 130d may be arranged in the body 120. The third side part 130c may be arranged between the second edge portion 135b and the third inclined portion 138b. That is, the third side part 130c may extend from the second edge portion 135b. The third side part 130c may extend from the third inclined portion 138c. The fourth side part 130d may be arranged between the first edge portion 133b and the fourth inclined portion 138b. The fourth side part 130d may extend from the first edge portion 133b. The fourth side part 130d may extend from the fourth inclined portion 138b.

The first lead frame 130 may include a first stepped portion 136 on a lower surface thereof. The first stepped portion 136 may be arranged along a periphery of the lower surface of the first lead frame 130. The first stepped portion 136 of the embodiment may be arranged under the second to fourth side parts 130b to 130d. The first stepped portion 136 may be spaced apart from the first side part 130a by a specific gap. Because the first side part 130a is exposed to the outside such that an external force by the cutting process is concentrated in the first side part 130a, the first stepped portion 136 may be spaced apart from the first side part 130a for strength. The first stepped portion 136 may be recessed and the cross-section of the first stepped portion 136 may be stepped, but the present disclosure is not limited thereto. The first stepped portion 136 widens a contact area with the body 120 to improve a coupling force with the body 120. Further, the first stepped portion 136 may restrain penetration of external moisture due to the step structure. The first stepped portion 136 may be formed by etching a portion of a periphery of the lower surface of the first lead frame 130, but the present disclosure is not limited thereto. The thickness of the first stepped portion 136 may be 50% of the thickness of the first lead frame 130, but the present disclosure is not limited thereto. For example, the thickness of the first stepped portion 136 may be not less than 50% of the thickness of the first lead frame 130. When the thickness of the first stepped portion 136 is less than 50% of the thickness of the first lead frame 130, deformation, such as distortion, may occur around the first stepped portion 136 in a process of manufacturing the first lead frame 130. Accordingly, the thickness of the first stepped portion 136 may be not less than 50% of the thickness of the first lead frame 130 in consideration of deformation of the shape of the first lead frame 130.

The first lead frame 130 may include a plurality of first through-holes 137. The plurality of first through-holes 137 may include a function of improving a coupling force with the body 120. The plurality of first through-holes 137 may increase a joining area between the body 120 and the first lead frame 130, and accordingly, may improve a coupling force between the body 120 and the first lead frame 130. For example, the first through-hole 137 may extend from an upper surface 130e of the first lead frame 130 to a lower surface of the first lead frame 130. The first through-hole 137 may be arranged adjacent to the first side part 130a. The first through-hole 137 may be arranged at a corner of the first lead frame 130 that are adjacent to the first side part 130a, but the present disclosure is not limited thereto. The location and diameter of the first through-hole 137 may be freely changed. The first through-hole 137 may include a stepped portion (not illustrated) in an area that contacts a lower surface of the first lead frame 130, but the present disclosure is not limited thereto.

The second lead frame 140 may include fifth to eighth side parts 140a to 140d, and an upper surface 140e on which the protective element 160 is mounted. The fifth to eighth side parts 140a to 140d may be arranged outside the second lead frame 140.

The fifth side part 140a may correspond to the second side surface 122 of the body 120. The fifth side part 140a may be exposed from the second side surface 122 of the body 120. The fifth side part 140a may protrude outwards from the second side surface 122 of the body 120.

The fifth side part 140a may be exposed from the second side surface 122 of the body 120. The fifth side surface 140a may include a second protrusion 141 that protrudes outwards, and third and fourth cutaway parts 143 and 145 that are arranged on opposite sides of the second protrusion 141.

The second protrusion 141 may include a second contact part 141a. The second contact part 141a may include a pad function for inputting a driving signal in an inspection process of the light emitting package 100. That is, the second contact part 141a may include an electric contact function for inputting a driving signal in an inspection process. The second protrusion 141 may protrude outwards further than the third and fourth cutaway parts 143 and 145. The second contact part 141a may be arranged at an end of the second protrusion 141. The second contact part 141a may be arranged on an outer side of the third and fourth cutaway parts 143 and 145. The second protrusion 141 and the second contact part 141a may be formed of a conductive material that is resistant to oxidation and highly reflective. For example, the first layer, for example, including silver (Ag) may be plated on surfaces of the second protrusion 141 and the second contact part 141a, but the present disclosure is not limited thereto. A fourth width W4 of the second contact part 141a in the second direction Y that is perpendicular to the first direction X may be not less than 300 μm. When the fourth width W4 of the second contact part 141a is less than 300 μm, an external signal contact defect of the inspect process may be caused. The first and second protrusion 131 and 141 may be arranged on the first and second outer surfaces 121 and 122 of the light emitting package 100 that are symmetrical to each other. The first and second contact parts 131a and 141a may be arranged on the first and second outer surfaces 121 and 122 of the light emitting package 100 that are symmetrical to each other.

In the embodiment, the third and fourth cutaway parts 143 and 145, from which cutaway surfaces are exposed through a cutting process may be arranged in an area that deviates from the second contact part 141a of the second protrusion 141, to which a driving signal is input. For example, in the embodiment, the third and fourth cutaway parts 143 and 145 is configured such that the second layer having a contact resistance that is higher than that of the first layer may be exposed to the outside, through a cutting process. The third and fourth cutaway parts 143 and 145 may be arranged in an area that deviates from the second contact part 141a of an electrical contact point so that lowering of the electrical characteristics of the third and fourth cutaway parts 133 and 135 may be restrained.

The third cutaway part 143 may extend from the second protrusion 141 in a direction that is opposite to the second direction Y. The fourth cutaway part 145 may extend from the second protrusion 141 in the second direction Y. The third and fourth cutaway parts 143 and 145 may be formed through a process of cutting a metal frame, by which the light emitting package 100 is manufactured. The third and fourth cutaway parts 143 and 145 may be formed on the fifth side part 140a of the second lead frame 140 through the cutting process. For example, the third and fourth cutaway parts 143 and 145 are configured such that the second layer may be exposed from the first layer. The third and fourth cutaway parts 143 and 145 may have a structure that is stepped from the second contact part 141a. The height of the step between the second contact part 141a and the third and fourth cutaway parts 143 and 145 may be not less than 10 μm. For example, the height of the step between the second contact part 141a and the third and fourth cutaway parts 143 and 145 may be 10 μm to 300 μm. When the height of the step between the second contact part 141a and the third and fourth cutaway parts 143 and 145 is less than 10 μm, the third and fourth cutaway parts 143 and 145 and a connection part of the inspection process, as well as the second contact part 141a, may contact each other, lowering the reliability of the inspection process. When the height of the step between the second contact part 141a and the third and fourth cutaway parts 143 and 145 exceeds 300 μm, an area of the fifth side part 140a, which is exposed to a side surface of the light emitting package 100, increases, and accordingly, productivity may lower and the design of the product may be restricted as well. The fifth width W5 of the third cutaway part 133 in the second direction Y may be 100 μm to 500 μm, but the present disclosure is not limited thereto. The sixth width W6 of the fourth cutaway part 145 in the second direction Y may be 100 μm to 500 μm, but the present disclosure is not limited thereto. The fifth and sixth widths W5 and W6 of the third and fourth cutaway parts 143 and 145 may be the same, but the present disclosure is not limited thereto.

The third cutaway part 143 may include a fifth inclined portion 143a that extends from the second contact part 141a, and a third edge portion 143b that extends from the fifth inclined portion 143a. The third edge portion 143b may be arranged to be closer to the body 120 than to the second contact part 141a. That is, the second contact part 141a may be arranged on an outer side of the third edge portion 143b. The third edge portion 143b may be spaced apart from the second contact part 141a in parallel in the first direction X.

The fourth cutaway part 145 may include a sixth inclined portion 145a that extends from the second contact part 141a, and a fourth edge portion 145b that extends from the sixth inclined portion 145a. That is, the second contact part 141a may be arranged on an outer side of the fifth edge portion 145b. The fourth edge portion 145b may be spaced apart from the second contact part 141a in parallel in the first direction X.

The horizontal widths of the fifth and sixth inclined portions 143a and 145a and the third and fourth edge portions 143b and 145b may employ the technical features of the first and second inclined portions 133a and 135a and the first and third edge portions 133b and 135b.

The third and fourth cutaway parts 143 and 145 may be symmetrical to each other in the second direction Y. The fifth and sixth inclined portions 143a and 145a may be symmetrical to each other, and the third and fourth edge portions 143b and 145b may overlap each other in parallel in the second direction Y. The third and fourth edge portions 143b and 145b may be arranged on the same plane in the second direction Y.

The sixth side part 140b may be arranged adjacent to the first lead frame 130. The sixth side part 140b may face the second side part 130b of the first lead frame 130. The sixth side part 140b is not exposed to the outside due to the body 120. The second lead frame 140 may include seventh and eighth inclined portions 148a and 148b that are symmetrical to each other in the second direction Y, at opposite ends of the sixth side part 140b. The seventh and eighth inclined portions 148a and 148b may increase a joining area between the body 120 and the second lead frame 140, thereby improving a coupling force between the body 120 and the second lead frame 140. For example, the body 120 may be coupled to the first and second lead frames 130 and 140 through an injection-molding process. The seventh and eighth inclined portions 148a and 148b may improve injection flows between the first and second lead frames 130 and 140 in a process of injection-molding the body 120. An inclination angle that is defined by the seventh inclined portion 148a and the sixth side part 140b may greater than 90° and is less than 180°. Further, an inclination angle that is defined by the seventh inclined portion 148a and the seventh side part 140c may greater than 90° and is less than 180°. The inclination angles may be the same or different. An inclination angle of the eighth inclined portion 148b may employ the characteristics of the seventh inclined portion 148a.

The seventh and eighth side parts 140c and 140d may be symmetrical to each other and may have flat surfaces. The seventh and eighth side parts 140c and 140d are not exposed to the outside due to the body 120. The seventh and eighth side parts 140c and 140d may be arranged in the body 120. The seventh side part 140c may be arranged between the fourth edge portion 145b and the seventh inclined portion 148a. The seventh side part 140c may extend from the fourth edge portion 145b. The seventh side part 140c may extend from the seventh inclined portion 148a. The eighth side part 140d may be arranged between the third edge portion 143b and the eighth inclined portion 148b. The eighth side part 140d may extend from the third edge portion 143b. The eighth side part 140d may extend from the eighth edge portion 148b.

The second lead frame 140 may include a second stepped portion 146 on a lower surface thereof. The second stepped portion 146 may be arranged along a periphery of the lower surface of the second lead frame 140. The second stepped portion 146 of the embodiment may be arranged under the sixth to eighth side parts 140b to 140d. The second stepped portion 146 may be spaced apart from the fifth side part 140a by a specific gap. Because the fifth side part 140a is exposed to the outside such that an external force by the cutting process is concentrated in the fifth side part 146, the second stepped portion 146 may be spaced apart from the fifth side part 140a for strength. The second stepped portion 146 may be recessed and the cross-section of the second stepped portion 146 may be stepped, but the present disclosure is not limited thereto. The second stepped portion 146 widens a contact area with the body 120 to improve a coupling force with the body 120. Further, the second stepped portion 146 may restrain penetration of external moisture due to the step structure. The second stepped portion 146 may be formed by etching a portion of a periphery of the lower surface of the second lead frame 140, but the present disclosure is not limited thereto. The thickness of the second stepped portion 146 may be 50% of the thickness of the second lead frame 140, but the present disclosure is not limited thereto. For example, the thickness of the second stepped portion 146 may be not less than 50% of the thickness of the second lead frame 140. When the thickness of the second stepped portion 146 is less than 50% of the thickness of the second lead frame 140, deformation, such as distortion, may occur around the second stepped portion 146 in a process of manufacturing the second lead frame 140. Accordingly, the thickness of the second stepped portion 146 may be not less than 50% of the thickness of the second lead frame 140 in consideration of deformation of the shape of the second lead frame 140.

The first lead frame 140 may include a second through-hole 147. The second through-hole 147 may include a function of improving a coupling force with the body 120. The second through-hole 147 may increase a joining area between the body 120 and the second lead frame 140, and accordingly, may improve a coupling force between the body 120 and the second lead frame 140. The second through-hole 147 may extend from an upper surface 140e of the second lead frame 140 to a lower surface of the second lead frame 140. The second through-hole 147 may be arranged adjacent to the fifth side part 140a. The second through-hole 147 may be arranged adjacent to the fifth lead frame 140a and adjacent to a central portion of the second lead frame 140, but the present disclosure is not limited thereto. The location and diameter of the second through-hole 147 may be freely changed. The second through-hole 147 may include a stepped portion (not illustrated) in an area that contacts a lower surface of the second lead frame 140, but the present disclosure is not limited thereto.

In the embodiment, because the first contact part 131a of a surface type is arranged at an end of the first protrusion 131 of the first lead frame 130, the second contact parts 141a of a surface type are arranged at ends of the second protrusion 141 of the second lead frame 140, and the first and second contact parts 131a and 141a are spaced apart of the cutting line such that the first layers L1, for example, including silver (Ag) are arranged in the first and second contact parts 131a and 141a, corrosion by oxidation may be restrained.

In the embodiment, because the first and second contact part 131a and 141a of the first and second lead frames 130 and 140 are spaced apart from the cutting line such that the first layers L1, for example, including silver (Ag) are included on the surfaces of the first and second contact parts 131a and 141a, the reliability of the inspection process may be improved.

Figure 6:
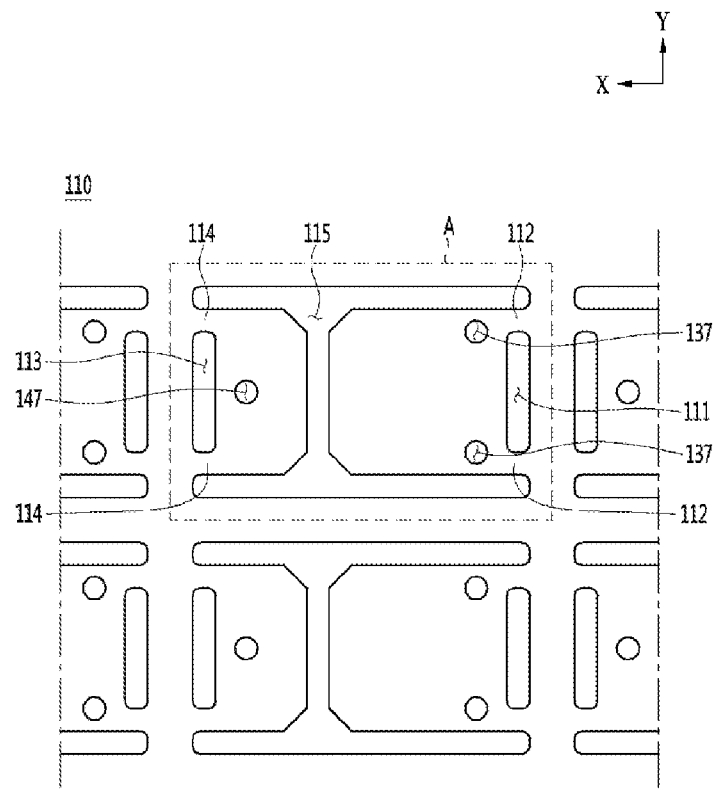
FIGS. 6 and 7 are views illustrating a process of manufacturing a unit light emitting package according to an embodiment.
Figure 7:
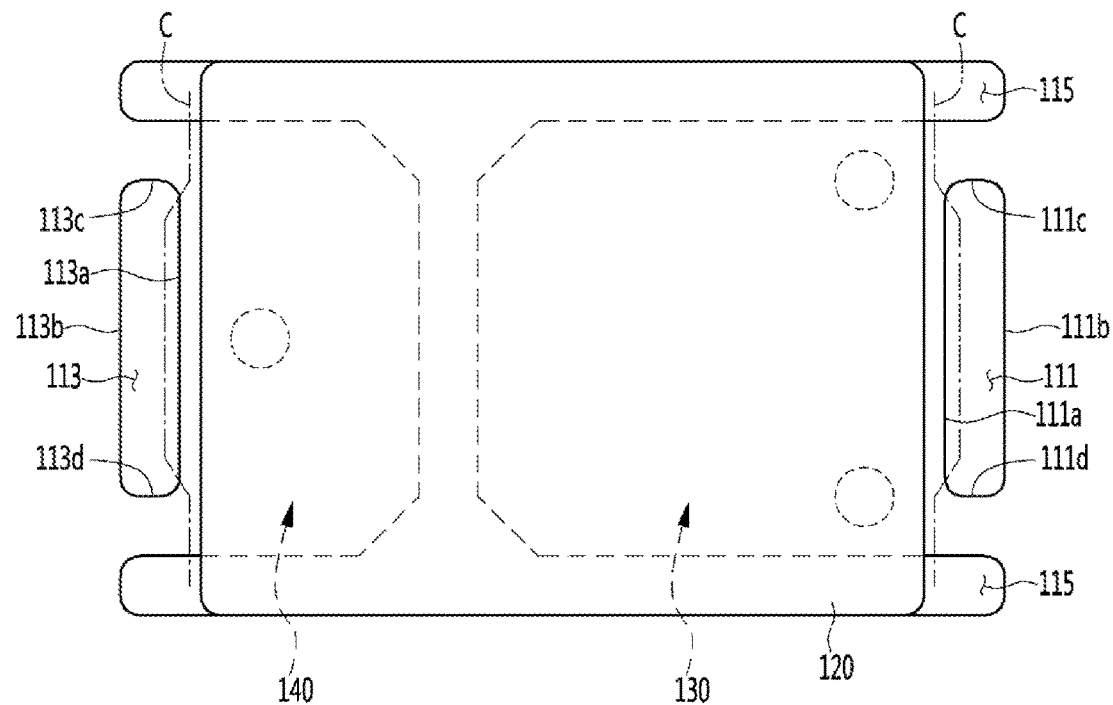

FIGS. 6 and 7 are views illustrating a process of manufacturing a unit light emitting package according to an embodiment.

Referring to FIGS. 6 and 7, a metal frame 110 of the embodiment may include a plurality of lead frames A. The metal frame 110 may include a first slit 111, a second slit 113, a separation hole 115, a first through-hole 137, a second through-hole 147, and a plurality of first and second connectors 112 and 114.

The metal frame 110 may separate first and second lead frames 130 and 140 in a first direction X through the separation hole 115.

The first connector 112 may be arranged between the first slit 111 and the separation hole 115 in the second direction Y that is perpendicular to the first direction X. The first connector 112 may be arranged on a cutting line C.

The second connector 114 may be arranged between the second slit 113 and the separation hole 115 in the second direction Y. The second connector 114 may be arranged on the cutting line C.

In the embodiment, if a process of injection-molding the body 120 on the metal frame 110 is completed, the metal frame 110 is cut along the cutting line C to be separated as a unit light emitting package.

The cutting line C may be spaced apart from the body 120 by a specific gap. The cutting line C may be situated on the first connector 112 and the first slit 111, and may be situated on the second connector 114 and the second slit 113.

Here, the first slit 111 may include first to fourth inner surfaces 111a to 111d, and the second slit 113 may include fifth to eighth inner surfaces 113a to 113d.

The cutting line C may cross the first inner surface 111a and the third and fourth inner surfaces 111c and 111d of the first slit 111, and may cross the fifth inner surface 113a and the seventh and eighth inner surfaces 113c and 113d of the second slit 113.

Referring to FIGS. 1 to 7, in the embodiment, the first and second contact parts 131a and 141a of the first and second lead frames 130 and 140 may be spaced apart from the cutting line C by the structure of the metal frame 110 including the first slit 111, the second slit 113, the separation hole 115, the first through-hole 137, the second through-hole 147, and the plurality of first and second connectors 112 and 114. For example, each of the first to fifth side parts 130a and 140a includes first and second protrusions 131 and 141, and first and second contact parts 131a and 141a of a surface type are arranged at ends of the first and second protrusions 131 and 141 of the first and second lead frames 130 and 140, respectively. Accordingly, because the first and second contact parts 131a and 141a are spaced apart from the cutting line C such that the first layers L1, for example, including silver (Ag) are plated on the surfaces of the first and second contact parts 131a and 141a, corrosion by oxidation may be restrained and the first layers L1 may be arranged as electrical contact points.

In the embodiment, because the first and second contact part 131a and 141a of the first and second lead frames 130 and 140 are spaced apart from the cutting line such that the first layers L1, for example, including silver (Ag) are included on the surfaces of the first and second contact parts 131a and 141a, the reliability of the inspection process may be improved.

Figure 8:
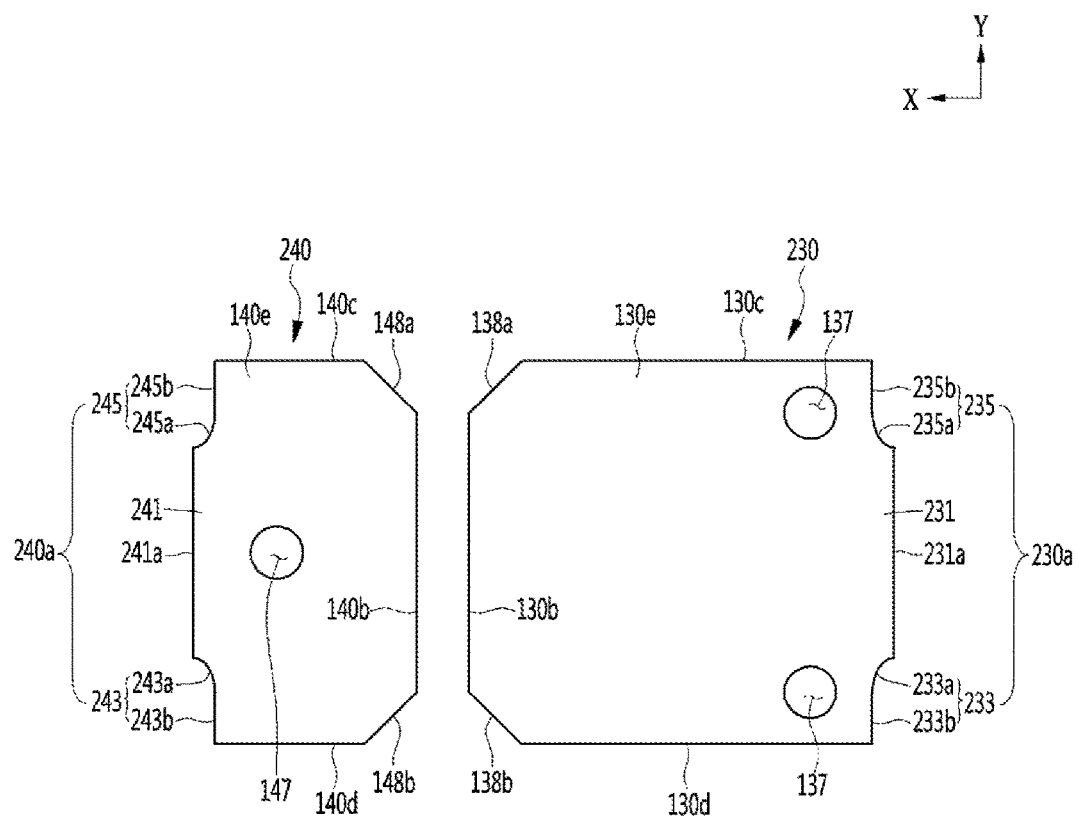
FIG. 8 is a plan view illustrating first and second lead frames according to another embodiment.

FIG. 8 is a plan view illustrating first and second lead frames according to another embodiment.

As illustrating in FIG. 8, the light emitting package according to the second embodiment may employ the technical features of the light emitting package 100 according to the embodiment of FIGS. 1 to 5, except for the first side part 230a of the first lead frame 230 and the fifth side part 240a of the second lead frame 240.

The first side part 230a of the first lead frame 230 may include a first protrusion 231 that protrudes outwards, and first and second cutaway parts 233 and 235 that are arranged on opposite sides of the first protrusion 231. The first protrusion 231 may protrude outwards further than the first and second cutaway parts 233 and 235. The first protrusion 231 may include a first contact part 231a. The first protrusion 231 and the first contact part 231a may employ the technical features of the light emitting package of FIGS. 1 to 4.

The first cutaway part 233 may extend from the first protrusion 231 in a direction that is opposite to the second direction Y. The second cutaway part 235 may extend from the first protrusion 231 in the second direction Y. The first and second cutaway parts 233 and 235 may be formed through a process of cutting a metal frame, by which the light emitting package is manufactured. The first and second cutaway parts 233 and 235 may be formed on the first side part 230a of the first lead frame 230 through the cutting process. For example, the sections of the first and second cutaway parts 233 and 235 may be configured such that second layer, for example, including copper (Cu) may be exposed from the first layer, for example, including silver (Ag). The first and second cutaway parts 233 and 235 may have a structure that is stepped from the first contact part 231a. The height H of the step between the first contact part 231a and the first and second cutaway parts 233 and 235 may be not less than 10 μm. For example, the height H of the step between the first contact part 231a and the first and second cutaway parts 233 and 235 may be 10 μm to 300 μm. When the height H of the step between the first contact part 231a and the first and second cutaway parts 233 and 235 is less than 10 μm, the second layer, for example, including copper (Cu), which may be corroded by oxidation, may contact the first and second cutaway parts 233 and 235 exposed to the outside and a connection part of an inspection process, lowering the reliability of the inspection process. When the height H of the step between the first contact part 131a and the first and second cutaway parts 133 and 135 exceeds 300 μm, an area of the first side part 130a, which is exposed to a side surface of the light emitting package 100, increases, and accordingly, productivity may lower and the design of the product may be restricted as well. The width of the first cutaway part 233 in the second direction Y may be 100 μm to 500 μm, but the present disclosure is not limited thereto. The width of the second cutaway part 235 in the second direction Y may be 100 μm to 500 μm, but the present disclosure is not limited thereto. The widths of the first and second cutaway parts 233 and 235 may be the same, but the present disclosure is not limited thereto.

The first cutaway part 233 may include a first bending portion 233a that extends from the first contact part 231a, and a first edge portion 233b that extends from the first bending portion 233a. The first edge portion 233b may be arranged to be closer to the body 120 than to the first contact part 231a. That is, the first contact part 231a may be arranged on an outer side of the first edge portion 233b. The first edge portion 233b may be spaced apart from the first contact part 231a in parallel in the first direction X.

The second cutaway part 235 may include a second bending portion 235a that extends from the first contact part 231a, and a second edge portion 235b that extends from the second bending portion 235a. The second edge portion 235b may be arranged on an inner side of the first contact part 231a. That is, the first contact part 231a may be arranged on an outer side of the second edge portion 235b. The second edge portion 235b may be spaced apart from the first contact part 231a in parallel in the first direction X.

The first and second cutaway parts 233 and 235 may be symmetrical to each other in the second direction Y. The first and second bending portions 233a and 235a may be symmetrical to each other, and the first and second edge portions 233b and 235b may overlap each other in the second direction Y. The first and second edge portions 233b and 235b may be arranged on the same plane in the second direction Y.

The fifth side part 240a of the second lead frame 240 may include a second protrusion 241 that protrudes outwards, and third and fourth cutaway parts 243 and 245 that are arranged on opposite sides of the second protrusion 241. The second protrusion 241 may protrude outwards further than the third and fourth cutaway parts 243 and 245. The second protrusion 241 may include a second contact part 241a. The second contact part 241a may be arranged at an end of the second protrusion 241. The second protrusion 241 and the second contact part 241a may employ the technical features of the light emitting package of FIGS. 1 to 4.

The third cutaway part 243 may extend from the second protrusion 241 in a direction that is opposite to the second direction Y. The fourth cutaway part 245 may extend from the second protrusion 241 in the second direction Y. The third and fourth cutaway parts 243 and 245 may be formed through a process of cutting a metal frame, by which the light emitting package is manufactured. The third and fourth cutaway parts 243 and 245 may be formed on the fifth side part 240a of the second lead frame 240 through the cutting process. For example, the third and fourth cutaway parts 243 and 245 are configured such that the second layer may be exposed from the first layer. The third and fourth cutaway parts 243 and 245 may have a structure that is stepped from the second contact part 241a. The height of the step between the second contact part 141a and the third and fourth cutaway parts 243 and 245 may be not less than 10 μm. For example, the height of the step between the second contact part 241a and the third and fourth cutaway parts 243 and 245 may be 10 μm to 300 μm. When the height of the step between the second contact part 241a and the third and fourth cutaway parts 243 and 245 is less than 10 μm, the second layer, for example, including copper (Cu), which may be corroded by oxidation, may contact the third and fourth cutaway parts 243 and 245 exposed to the outside and a connection part of an inspection process, lowering the reliability of the inspection process. When the height of the step between the second contact part 241a and the third and fourth cutaway parts 243 and 245 exceeds 300 μm, an area of the fifth side part 240a, which is exposed to a side surface of the light emitting package, increases, and accordingly, productivity may lower and the design of the product may be restricted as well. The width of the third cutaway part 243 in the second direction Y may be 100 μm to 500 μm, but the present disclosure is not limited thereto. The width of the fourth cutaway part 245 in the second direction Y may be 100 μm to 500 μm, but the present disclosure is not limited thereto. The widths of the third and fourth cutaway parts 243 and 245 may be the same, but the present disclosure is not limited thereto.

The third cutaway part 243 may include a third bending portion 243a that extends from the second contact part 241a, and a third edge portion 243b that extends from the third bending portion 243a. The third edge portion 243b may be arranged to be closer to the body than to the second contact part 241a. That is, the second contact part 241a may be arranged on an outer side of the third edge portion 243b. The third edge portion 243b may be spaced apart from the second contact part 241a in parallel in the first direction X.

The fourth cutaway part 245 may include a fourth bending portion 245a that extends from the second contact part 241a, and a fourth edge portion 245b that extends from the fourth bending portion 245a. The fourth edge portion 245b may be arranged on an inner side of the second contact part 241a. That is, the second contact part 241a may be arranged on an outer side of the fourth edge portion 245b. The fourth edge portion 245b may be spaced apart from the second contact part 241a in parallel in the first direction X.

The third and fourth cutaway parts 243 and 245 may be symmetrical to each other in the second direction Y. The third and fourth bending portions 243a and 245a may be symmetrical to each other, and the third and fourth edge portions 243b and 245b may overlap each other in the second direction Y. The third and fourth edge portions 243b and 245b may be arranged on the same plane in the second direction Y.

A method of manufacturing a light emitting package of the second embodiment may employ the technical features of the embodiment of FIGS. 1 to 7.

A first cutaway part 133 including a first bending portion 233a and a first linear portion 233b and a second cutaway part 233 including a second bending portion 235a and a second linear portion 235b on opposite sides of the first contact part 231a may be arranged, and a third cutaway part 243 including a third bending portion 243a and a third edge portion 243b and a fourth cutaway part 245 including a fourth bending portion 245a and a fourth edge portion 245b on opposite sides of the second contact part 241a may be arranged. Because the first and second contact parts 231a and 241a may be spaced apart from the cutting line by the first to fourth cutaway parts 233, 235, 243, and 245 such that first layers, for example, including silver (Ag) are on the surfaces of the first and second contact parts 231a and 241a, corrosion by oxidation may be restrained.

In the second embodiment, because the first and second contact part 230a and 240a of the first and second lead frames 230 and 240 are spaced apart from the cutting line such that the first layers, for example, including silver (Ag) are included on the surfaces of the first and second contact parts 230a and 240a, the reliability of the inspection process may be improved.

Figure 9:
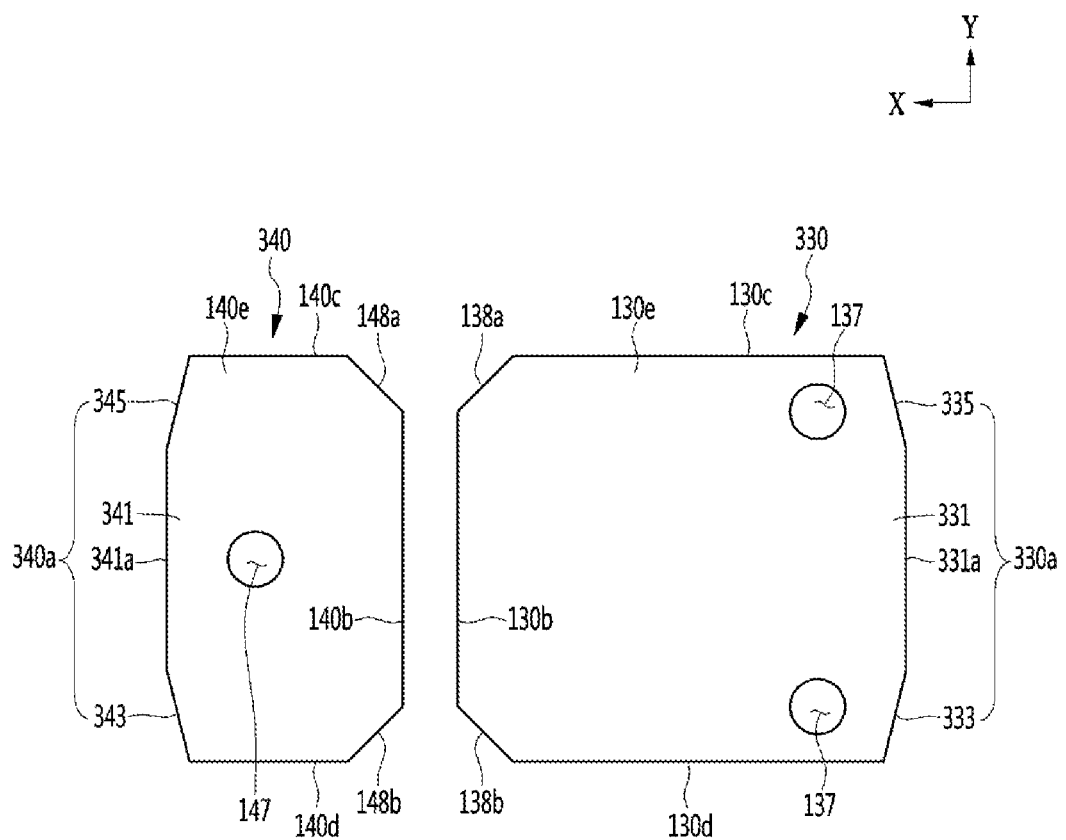
FIG. 9 is a plan view illustrating first and second lead frames according to another embodiment.

FIG. 9 is a plan view illustrating first and second lead frames according to another embodiment.

As illustrating in FIG. 9, the light emitting package according to the third embodiment may employ the technical features of the light emitting package 100 according to the embodiment of FIGS. 1 to 5, except for the first side part 330a of the first lead frame 330 and the fifth side part 340a of the second lead frame 340.

The first side part 330a of the first lead frame 330 may include a first protrusion 331 that protrudes outwards, and first and second cutaway parts 333 and 335 that are arranged on opposite sides of the first protrusion 331. The first protrusion 331 may protrude outwards further than the first and second cutaway parts 333 and 335. The first protrusion 331 may include a first contact part 331a. The first protrusion 331 and the first contact part 331a may employ the technical features of the light emitting package of FIGS. 1 to 5.

The first and second cutaway parts 333 and 335 may extend from the first protrusion 331 in the second direction Y. The first and second cutaway parts 333 and 335 may extend from opposite ends of the first protrusion 331 in the second direction Y. The first and second cutaway parts 333 and 335 may be formed through a process of cutting a metal frame, by which the light emitting package is manufactured. The first and second cutaway parts 333 and 335 may be formed on the first side part 330a of the first lead frame 330 through the cutting process. For example, the sections of the first and second cutaway parts 333 and 335 may be configured such that second layer, for example, including copper (Cu) may be exposed from the first layer, for example, including silver (Ag). The first and second cutaway parts 333 and 335 may have a structure that is inclined from the first contact part 331a. The first and second cutaway part 333 and 335 may become closer to the second side part 330b of the first lead frame 330 as it becomes far from the first contact part 331a. The first cutaway part 333 may be arranged between the first protrusion 331 and the fourth side part 330d. The second cutaway part 335 may be arranged between the first protrusion 331 and the third side part 130c. The heights of the first and second cutaway parts 333 and 335 in the first direction X may be not less than 10 μm. For example, the heights of the first and second cutaway parts 333 and 335 in the first X may be 10 μm to 300 μm. When the heights of the first and second cutaway parts 333 and 335 are less than 10 μm, the second layer, for example, including copper (Cu), which may be corroded by oxidation, may contact the first and second cutaway parts 333 and 335 exposed to the outside and a connection part of an inspection process, lowering the reliability of the inspection process. When the heights of the first and second cutaway parts 333 and 335 in the first direction X exceed 300 μm, an area of the first side part 330a exposed to a side of the light emitting package significantly increases, so that productivity may lower and the design of the product may be restricted as well. The width of the first cutaway part 333 in the second direction Y may be 100 μm to 500 μm, but the present disclosure is not limited thereto. The width of the second cutaway part 335 in the second direction Y may be 100 μm to 500 μm, but the present disclosure is not limited thereto. The widths of the first and second cutaway parts 333 and 335 may be the same, but the present disclosure is not limited thereto. The first and second cutaway parts 333 and 335 may be symmetrical to each other in the second direction Y. The first and second cutaway parts 333 and 335 may be of a surface type. Angles between the first cutaway part 333, and the first protrusion 331 and the fourth side part 130d may be obtuse angles. Angles between the second cutaway part 335, and the first protrusion 331 and the third side part 130c may be obtuse angles.

The fifth side part 340a of the second lead frame 340 may include a second protrusion 341 that protrudes outwards, and third and fourth cutaway parts 343 and 345 that are arranged on opposite sides of the second protrusion 341. The first protrusion 331 may protrude outwards further than the third and fourth cutaway parts 343 and 345. The second protrusion 341 may include a second contact part 341a. The second protrusion 341 and the second contact part 341a may employ the technical features of the light emitting package of FIGS. 1 to 5.

The third cutaway part 343 may extend from the second protrusion 341 in a direction that is opposite to the second direction Y. The fourth cutaway part 345 may extend from the second protrusion 341 in the second direction Y. The third and fourth cutaway parts 343 and 345 may be formed through a process of cutting a metal frame, by which the light emitting package is manufactured. The third and fourth cutaway parts 343 and 345 may be formed on the fifth side part 340a of the second lead frame 340 through the cutting process. For example, the third and fourth cutaway parts 343 and 345 are configured such that the second layer may be exposed from the first layer. The third and fourth cutaway parts 343 and 345 may have a structure that is inclined from the second contact part 341a. The third and fourth cutaway part 343 and 345 may become closer to the sixth side part 140b of the second lead frame 330 as it becomes far from the second contact part 341a. The third cutaway part 343 may be arranged between the second protrusion 341 and the eighth side part 140d. The fourth cutaway part 345 may be arranged between the second protrusion 341 and the seventh side part 140c. The heights of the third and fourth cutaway parts 343 and 335 in the first direction X may be not less than 10 μm. For example, the heights of the third and fourth cutaway parts 343 and 345 in the first X may be 10 μm to 300 μm. When the heights of the third and fourth cutaway parts 343 and 345 are less than 10 μm, the second layer, for example, including copper (Cu), which may be corroded by oxidation, may contact the third and fourth cutaway parts 343 and 345 exposed to the outside and a connection part of an inspection process, lowering the reliability of the inspection process. When the heights of the third and fourth cutaway parts 343 and 345 in the first direction X exceed 300 μm, an area of the fifth side part 340a exposed to a side of the light emitting package significantly increases, so that productivity may lower and the design of the product may be restricted as well. The width of the third cutaway part 343 in the second direction Y may be 100 μm to 500 μm, but the present disclosure is not limited thereto. The width of the fourth cutaway part 345 in the second direction Y may be 100 μm to 500 μm, but the present disclosure is not limited thereto. The widths of the third and fourth cutaway parts 343 and 345 may be the same, but the present disclosure is not limited thereto. The third and fourth cutaway parts 343 and 345 may be symmetrical to each other in the second direction Y. The third and fourth cutaway parts 343 and 345 may be of a surface type. Angles between the third cutaway part 343, and the second protrusion 341 and the eighth side part 140d may be obtuse angles. Angles between the fourth cutaway part 345, and the second protrusion 341 and the seventh side part 140c may be obtuse angles.

Figure 5:
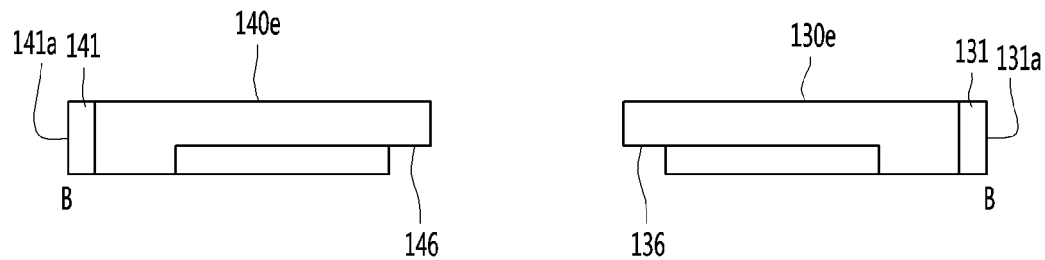
FIG. 5 is a sectional view illustrating the first and second lead frames, taken along B-B of FIG. 3.

A method of manufacturing a light emitting package of the third embodiment may employ the technical features of the embodiment of FIGS. 5 to 6.

In the third embodiment, first and second cutaway parts 333 and 335 that are inclined may be arranged on opposite sides of the first contact part 331a, and third and fourth cutaway parts 343 and 345 may be arranged on opposite sides of the second contact part 341a. Because the first and second contact parts 331a and 341a may be spaced apart from the cutting line such that first layers, for example, including silver (Ag) are on the surfaces of the first and second contact parts 331a and 341a, corrosion by oxidation may be restrained.

In the third embodiment, because the first and second contact part 331a and 341a of the first and second lead frames 330 and 340 are spaced apart from the cutting line such that the first layers, for example, including silver (Ag) are included on the surfaces of the first and second contact parts 331a and 341a, the reliability of the inspection process may be improved.

Figure 10:
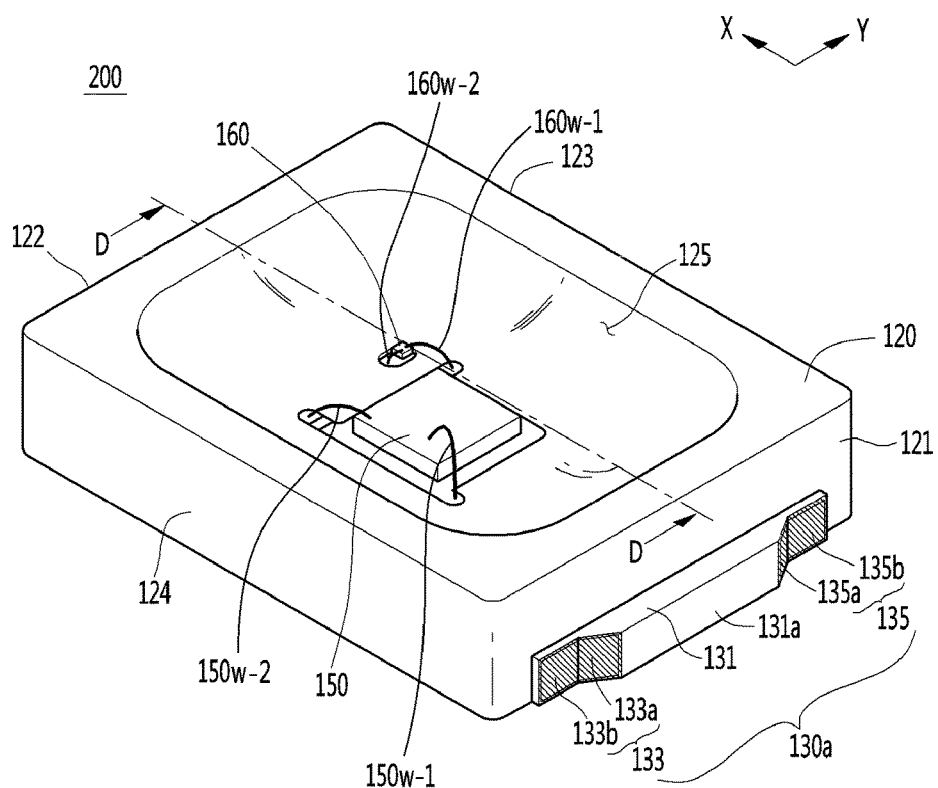
FIG. 10 is a plan view illustrating a light emitting package according to another embodiment.
Figure 11:
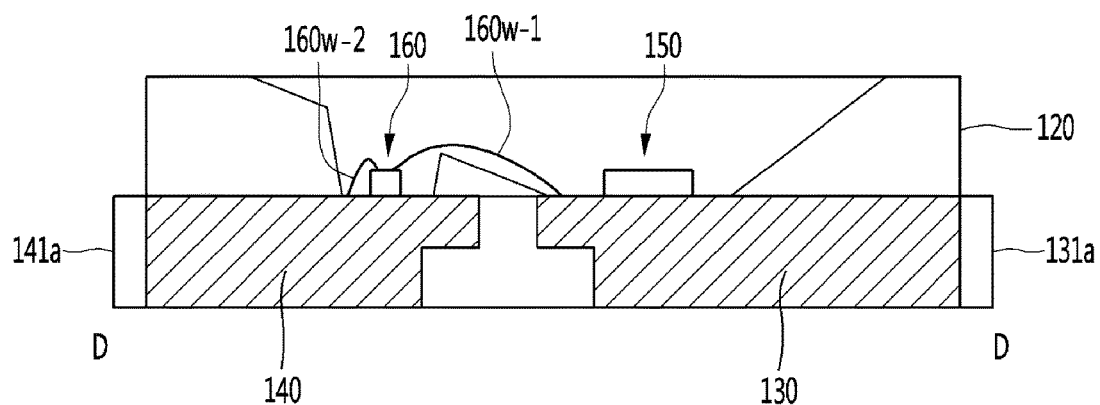
FIG. 11 is a sectional view illustrating the light emitting package taken along D-D of FIG. 10.

FIG. 10 is a plan view illustrating a light emitting package according to another embodiment. FIG. 11 is a sectional view illustrating the light emitting package taken along D-D of FIG. 10.

As illustrated in FIGS. 10 and 11, the light emitting package 200 of the second embodiment may employ the technical features of the light emitting package 100 of FIGS. 1 to 6, except for the light emitting element 150 and the protective element 160.

The light emitting element 150 and the protective element 160 may be of a horizontal type. For example, the light emitting element 150 and the protective element 160 may include wires that are coupled to the first and second lead frames 130 and 140.

For example, the light emitting element 150 may include first and second electrodes (not illustrated), and may include a first wire 150w-1 that electrically connects the first electrode and a first lead frame 130, and a second wire 150w-2 that electrically connects the second electrode and a second lead frame 140.

The protective element 160 may include third and fourth electrodes (not illustrated), and may include a third wire 160w-1 that electrically connects the third electrode and the first lead frame 130, and a fourth wire 160w-2 that electrically connects the fourth electrode and the second lead frame 140.

<Light Emitting Chip>

Figure 12:
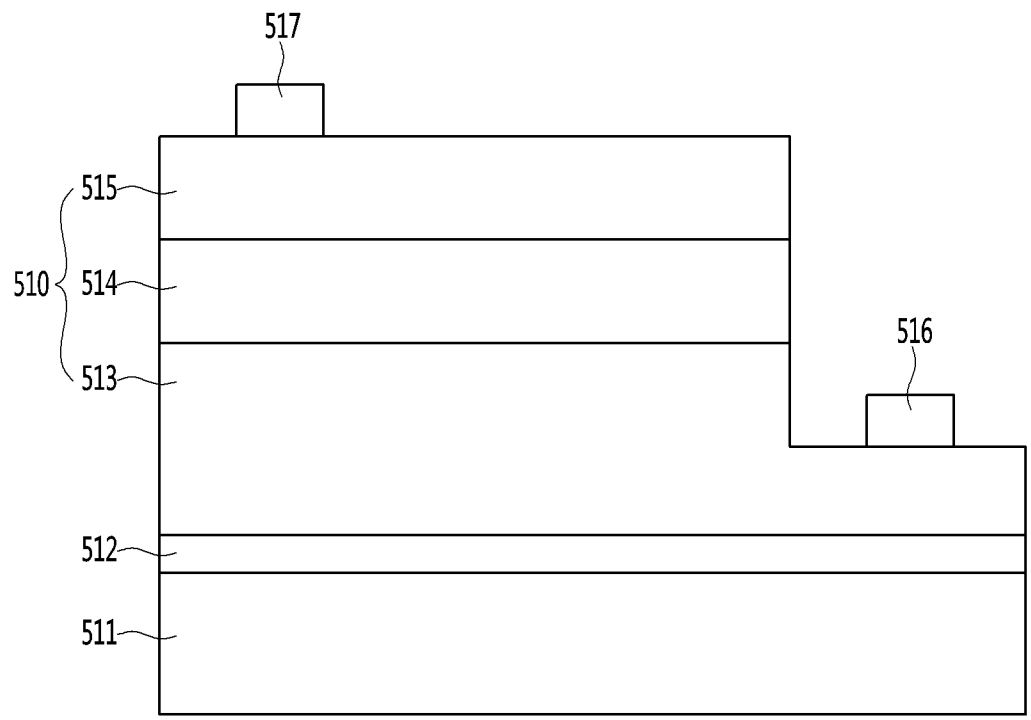
FIG. 12 is a sectional view illustrating a light emitting chip provided in a light emitting package of an embodiment.

FIG. 12 is a sectional view illustrating a light emitting chip provided in a light emitting package of an embodiment.

As illustrated in FIG. 12, the light emitting chip includes a substrate 511, a buffer layer 512, a light emitting structure 510, a first electrode 516, and a second electrode 517. The substrate 511 may be a translucent or non-translucent material, and may include a conductive or insulating substrate.

The buffer layer 512 reduces a difference between the lattice constants of the materials of the substrate 511 and the light emitting structure 510, and may be formed of a nitride semiconductor. A nitride semiconductor layer that is not doped by a dopant may be further formed between the buffer layer 512 and the light emitting structure 510 to improve the quality of crystals.

The light emitting structure 510 includes a first conductive semiconductor layer 513, an active layer 514, and a second conductive type semiconductor layer 515.

For example, the light emitting structure may be implemented by composite semiconductors such as group II-group IV and group III-group V. The first conductive type semiconductor layer 513 may be mono-layered or multi-layered. The first conductive type semiconductor layer 513 may be doped by a first conductive dopant. For example, when the first conductive type semiconductor layer 513 is a n type semiconductor layer, it may include a n type dopant. For example, the n type dopant may include Si, Ge, Sn, Se, and Te, but the present disclosure is not limited thereto. The first conductive semiconductor layer 513 may include an empirical formula of InxAlyGa1-x-yN ($0 \leq x \leq 1$, $0 \leq y \leq 1$, $0 \leq x+y \leq 1$). The first conductive semiconductor layer 513, for example, may include a stack structure of layers that include at least one of GaN, InN, AlN, InGaN, AlGaN, InAlGaN, AlInN, AlGaAs, GaP, GaAs, GaAsP, and AlGaInP.

A first clad layer may be formed between the first conductive semiconductor layer 513 and the active layer 514. The first clad layer may be formed of a GaN based semiconductor, and a band gap of the first clad layer may be not less than a band gap of the active layer 514. The first clad layer may be formed of a first conductive type, and may include a function of constraining carriers.

The active layer 514 is arranged on the first conductive type semiconductor layer 513, and selectively includes a single quantum well structure, a multiple quantum well (MQW) structure, a quantum wire structure, and a quantum dot structure. The active layer 514 includes a period of well layers and barrier layers. The well layer includes an empirical formula of InxAlyGa1-x-yN ($0 \leq x \leq 1$, $0 \leq y \leq 1$, $0 \leq x+y \leq 1$), and the barrier layer may include an empirical formula of InxAlyGa1-x-yN ($0 \leq x \leq 1$, $0 \leq y \leq 1$, $0 \leq x+y \leq 1$). One or more periods of well layers and barrier layers, for example, may be formed by using a stack structure of InGaN/GaN, GaN/AlGaN, InGaN/AlGaN, InGaN/InGaN, or InAlGaN/InAlGaN. The barrier layer may be formed of a semiconductor material having a band gap that is larger than a band gap of the well layer.

The second conductive semiconductor layer 515 is formed on the active layer 514. The second conductive semiconductor layer 515 may be implemented by a semiconductor composite, for example, a group II-group IV and group III-group V composite semiconductor. The second conductive type semiconductor layer 515 may be monolayered or multi-layered. When the second conductive semiconductor layer 515 is a p type semiconductor layer, the second conductive dopant is a p type dopant and may include Mg, Zn, Ca, Sr, and Ba. The second conductive type semiconductor layer 515 may be doped by a second conductive dopant. The first conductive semiconductor layer 515 may include an empirical formula of InxAlyGa1-x-yN ($0 \leq x \leq 2$, $0 \leq y \leq 1$, $0 \leq x+y \leq 1$). The second conductive semiconductor layer 515 may include any one of GaN, InN, AlN, InGaN, AlGaN, InAlGaN, AlInN, AlGaAs, GaP, GaAs, GaAsP, and AlGaInP.

The second conductive semiconductor layer 515 may include an ultra-lattice structure, and the ultra-lattice structure may include an InGaN/GaN ultra-lattice structure or an AlGaN/GaN ultra-lattice structure. The ultra-lattice structure of the second conductive semiconductor layer 515 abnormally diffuses currents included in a voltage, and may protect the active layer 514.

It has been described that the first conductive semiconductor layer 513 is a n type semiconductor layer and the second conductive semiconductor layer 515 is a p type semiconductor layer, but the first conductive type semiconductor layer 513 may be a p type semiconductor layer and the second conductive semiconductor layer 515 is a n type semiconductor layer and the present disclosure is not limited thereto. A semiconductor having a polarity that is opposite to that of the second conductive type, for example, a n type semiconductor layer (not illustrated) may be formed on the second conductive semiconductor layer 515. Accordingly, the light emitting structure 510 may be implemented by any one of an n-p junction structure, a p-n junction structure, an n-p-n junction structure, and a p-n-p junction structure.

The first electrode 516 is arranged on the first conductive semiconductor layer 513, and the second electrode 517 having a current diffusion layer is proved on the second conductive semiconductor layer 515.

<Light Emitting Chip>

Figure 13:
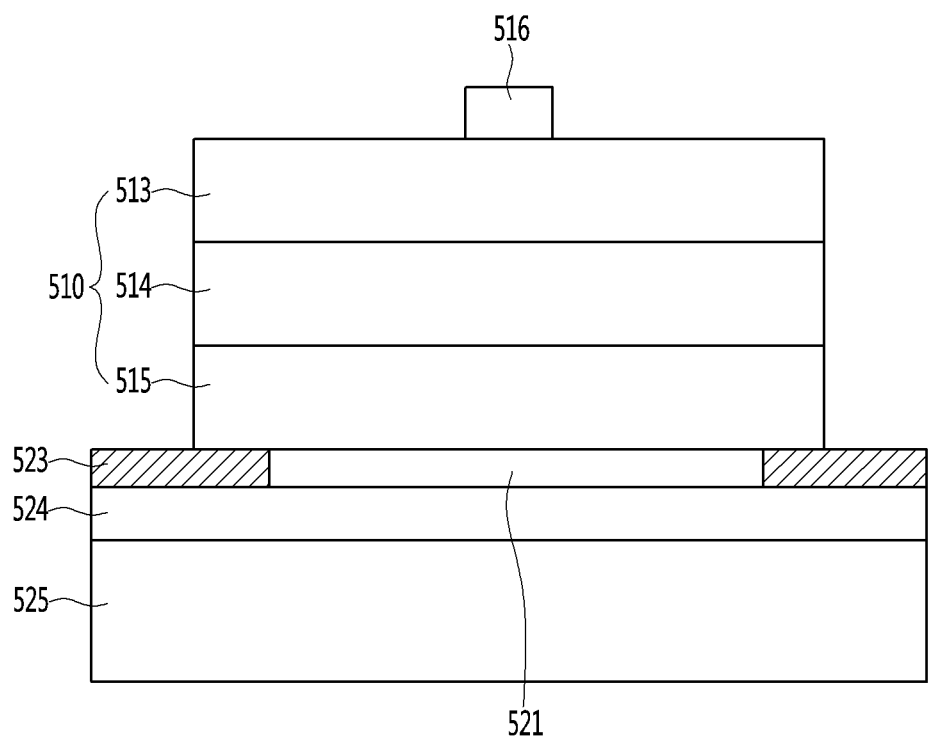
FIG. 13 is a sectional view illustrating another example of a light emitting chip provided in a light emitting package of the embodiment.

FIG. 13 is a sectional view illustrating another example of a light emitting chip provided in a light emitting package of the embodiment.

As illustrated in FIG. 13, a description of the same configuration of the light emitting chip of FIG. 9 will be omitted in the second example. In the light emitting chip of the second example, a contact layer 521 may be arranged under the light emitting structure 510, a reflective layer 524 may be arranged under the contact layer 521, a support member 525 may be arranged under the reflective layer 524, and a protective layer 523 may be arranged around the reflective layer 524 and the light emitting structure 510.

In the light emitting chip, the contact layer 521 and the protective layer 523, the reflective layer 524, and the support member 525 may be arranged under the second conductive semiconductor layer 515.

The contact layer 521 may make ohmic contact with a lower surface of the light emitting structure 510, for example, the second conductive semiconductor layer 515. The contact layer 521 may be formed of a material selected from a metal nitride, an insulating material, and a conductive material, and for example, may be formed of a material including, for example, indium tin oxide (ITO), indium zinc oxide (IZO), indium zinc tin oxide (IZTO), indium aluminum zinc oxide (IAZO), indium gallium zinc oxide (IGZO), indium gallium tin oxide (IGTO), aluminum zinc oxide (AZO), antimony tin oxide (ATO), gallium zinc oxide (GZO), Ag, Ni, Al, Rh, Pd, Ir, Ru, Mg, Zn, Pt, Au, Hf, a selective combination thereof. Further, the contact layer 521 may be multilayered by using the metal material and a translucent conductive material such as IZO, IZTO, IAZO, IGZO, IGTO, AZO, or ATO, and for example, may have a stack structure of IZO/Ni, AZO/Ag, IZO/Ag/Ni, and AZO/Ag/Ni. A current blocking layer that blocks a current to correspond to the electrode 516 may be further formed in the interior of the contact layer 521.

The protective layer 523 may be formed of a material selected from a metal oxide, an insulating material, and a conductive material, and for example, may be formed of a material including, for example, indium tin oxide (ITO), indium zinc oxide (IZO), indium zinc tin oxide (IZTO), indium aluminum zinc oxide (IAZO), indium gallium zinc oxide (IGZO), indium gallium tin oxide (IGTO), aluminum zinc oxide (AZO), antimony tin oxide (ATO), gallium zinc oxide (GZO), $SiO_2$, $SiO_x$, $SiO_xN_y$, $Si_3N_4$, $Al_2O_3$, and $TiO_2$. The protective layer 523 may be formed by using sputtering or deposition, and may prevent a metal such as the reflective layer 524 from short-circuiting layers of the light emitting structure 510.

The reflective layer 524 may include a metal. For example, the reflective layer 524 may be formed of Ag, Ni, Al, Rh, Pd, Ir, Ru, Mg, Zn, Pt, Au, Hf, or a selective combination thereof. The reflective layer 524 may have a width that is larger than the width of the light emitting structure 510 to improve light reflection efficiency. A metal layer for junction, a metal layer for diffusing heat, and the like may be further arranged between the reflective layer 524 and the support member 525, but the present disclosure is not limited thereto.

The support member 525 is a base substrate, and may be implemented by a metal such as copper (Cu), gold (Au), nickel (Ni), molybdenum (Mo), or copper-tungsten (Cu—W) or a carrier wafer (for example, Si, Ge, GaAs, ZnO, or SiC). A junction layer may be further formed between the support member 525 and the reflective layer 524.

<Lighting System>

Figure 14:
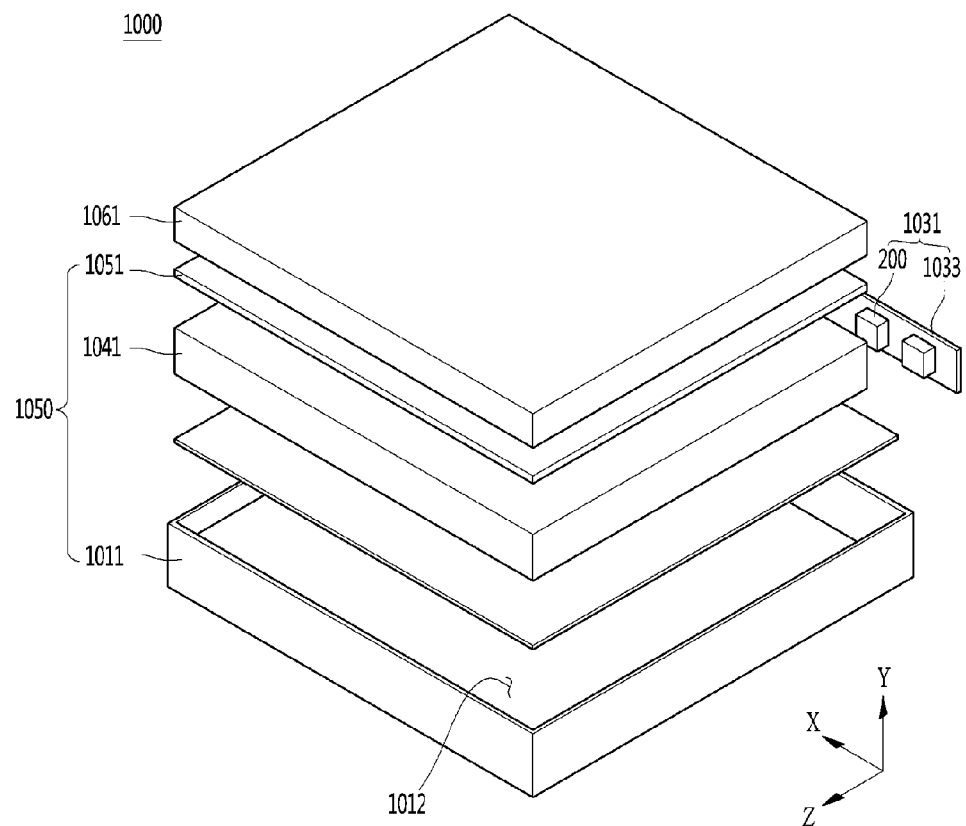
FIG. 14 is a perspective view illustrating a display device that includes the light emitting package of the embodiment.

FIG. 14 is a perspective view illustrating a display device that includes the light emitting package of the embodiment.

As illustrated, the display device 1000 of the embodiment may include a light guide plate 1041, a light source module 1031 that provides light to the light guide plate 1041, a reflective member 1022 under the light guide plate 1041, an optical sheet 1051 on the light guide plate, a display panel 1061 on the optical sheet 1051, and a bottom cover 1011 that receives the light guide plate 1041, the light source module 1031, and the reflective member 1022.

The bottom cover 1011, the reflective sheet 1022, the light guide plate 1041, and the optical sheet 1051 may be defined by a light unit 1050.

The light guide plate 1041 functions to diffuse light to provide a surface light source. The light guide plate 1041 is formed of a transparent material, and for example, may include any one of an acryl resin such as polymethyl metaacrylate (PMMA), and resins including polyethylene terephthalate (PET), poly carbonate (PC), cycloolefin copolymer (COC), and polyethylene naphthalate (PEN).

The light source module 1031 provides light to at least one surface of the light guide plate 1041, and ultimately is applied as a light source of the display device.

At least one light source module 1030 is provided to directly or indirectly provide light from one side surface of the light guide plate 1041. The light source module 1031 may include the light emitting package 110 according to the embodiment, and a plurality of light emitting packages 110 may be arranged on the substrate 1033 to be spaced apart from each other at a gap.

The substrate 1033 may be a printed circuit board (PCB) that includes a circuit pattern (not illustrated). However, the substrate 1033 may include a metal core PCB (MCPCB) and a flexible PCB (FPCB), as well as a general PCB, but the present disclosure is not limited thereto. The light emitting package 110 may be directly arranged on a side surface of the bottom cover 1011 or a heat dissipating plate.

The reflective member 1022 may be arranged under the light guide plate 1041. The reflective member 1022 may reflect light input to a lower surface of the light guide plate 1041 to improve the luminance of the light unit 1050. The reflective member 1022, for example, may be formed of PET, PC, or PVC, but the present disclosure is not limited thereto.

The bottom cover 1011 may receive the light guide plate 1041, the light source module 1031, and the reflective member 1022. The bottom cover 1011 may include a receiving part 1012 having an open-topped box shape, but the present disclosure is not limited thereto. The bottom cover 1011 may be coupled to a top cover, but the present disclosure is not limited thereto.

The bottom cover 1011 may be formed of a metal or a resin, and may be manufactured by using a process such as pressing or extrusion. Further, the bottom cover 1011 may include a conductive metal or a non-metal.

The display panel 1061, for example, is an LCD panel, and may include first and second transparent substrates that is opposite to each other, and a liquid crystal layer that is interposed between the first and second substrates. A polarized plate may be arranged on at least one surface of the display panel 1061. The display panel 1061 displays information through the light that passed through the optical sheet 1051. The display device 1000 may be applied to various portable terminals, a monitor of a notebook computer, a monitor of a laptop computer, or a television.

The optical sheet 1050 may be arranged between the display panel 1061 and the light guide plate 1041. The optical sheet 1051 may include at least one translucent sheet. The optical sheet 1051, for example, may include at least one of a diffusion sheet, at least one prism sheet, and a protective sheet. The diffusion sheet may include a function of diffusing input light. The prism sheet may include a function of condensing input light to a display area. The protective sheet may include a function of protecting the prism sheet.

<Lighting Device>

Figure 15:
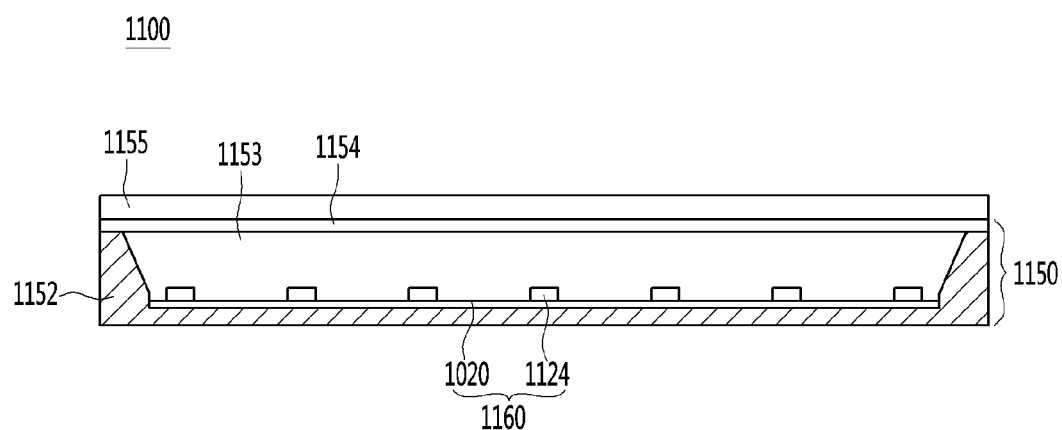
FIG. 15 is a sectional view illustrating another example of the display device that includes the light emitting package of the embodiment.

FIG. 15 is a sectional view illustrating another example of the display device that includes the light emitting package of the embodiment.

As illustrated in FIG. 15, the display device 1100 of the second example may include a bottom cover 1152, a substrate 1120 on which a light emitting package 110 is mounted, an optical member 1154, and a display panel 1155.

The substrate 1120 and the light emitting package 110 may be defined as a light source module 1160. The bottom cover 1152, the at least one light source module 1160, and the optical member 1154 may be defined as a light unit 1150. The bottom cover 1152 may be coupled to a top cover, but the present disclosure is not limited thereto. The light source module 1160 may include a substrate 1120, and a plurality of light emitting packages 110 that is arranged on the substrate 1120.

Here, the optical member 1154 may include at least one of a lens, a diffusion plate, a diffusion sheet, a prism sheet, and a protective sheet. The diffusion plate may be formed of PC or poly methyl methacrylate (PMMA). The diffusion sheet may diffuse input light, the prism sheet may condense the input light to a display area, and the protective sheet may protect the prism sheet.

The optical member 1154 is arranged on the light source module 1060 to use the light emitted from the light source module 1060 as a surface light source, and diffuses and condenses the light.

The light emitting element may include a light emitting package to be used as a light source of the lighting system, and for example, may be used as a light source such as a light source or a lighting device of an image display device.

An edge type backlight unit or a directing backlight unit may be used as a backlight unit of an image display device, a light or a bulb type may be used as a light source of a lighting device, or a light source of a mobile terminal may be used.

The light emitting element includes a laser diode in addition to the above-mentioned light emitting diode.

The laser diode may include a first conductive semiconductor layer, an active layer, and a second conductive semiconductor layer having the above-described structure, similarly to the light emitting element. Further, an electroluminescence phenomenon in which light is emitted when a current flows after a first conductive type semiconductor of p-type and a second conductive type semiconductor are joined to each other, but there are differences between the directionalities and phases of the light. That is, the laser diode may be configured such that light of a specific wavelength (a monochromatic beam) has the same phase and the same direction by using a stimulated emission phenomenon and a reinforced interference phenomenon, and due to the characteristics, it may be used in optical communication, medical equipment, or semiconductor process equipment.

A light receiving element, for example, may include a photodetector that is a transducer that detect light to convert the intensity of the light into an electrical signal. The photodetector includes an optical cell (silicon or selenium), a photoconductive element (cadmium sulfide, cadmium selenium), a photodiode (for example, a PD having a peak wavelength in a visible blind spectral region or a true blind spectral region), a phototransistor, a photon multiplier, a photoelectric tube (vacuum or encapsulation of gas), or an infra-red (IR) detector, but the present disclosure is not limited thereto.

Further, a semiconductor such as a photodetector may be manufactured by using a direct bandgap semiconductor that generally has excellent optical conversion efficiency. Further, the photodetector has various structures, and the most general structures include a pin type photodetector that uses a p-n junction, a Schottky photodetector that uses a Schottky junction, and a metal semiconductor metal (MSM) type photodetector.

The photodiode may include a first conductive type semiconductor layer, an active layer, and a second conductive type semiconductor layer having the above-described structure, similarly to a light emitting element, and has a pn junction or a pin structure. The photodiode is operated by applying a reverse bias or a zero bias, and electrons and holes are generated such that a current flows by inputting light to a photodiode. Then, the magnitude of a current may be substantially proportional to the intensity of light that is input to the photodiode.

A photocell or a solar cell is a kind of a photodiode, and may convert light into a current. The solar cell may include a first conductive semiconductor layer, an active layer, and a second conductive semiconductor layer having the above-described structure, similarly to the light emitting element.

Further, the solar cell may be used also as a rectifier of an electronic circuit through the rectification characteristics of a general diode using a p-n junction, and may be applied to an ultrahigh frequency circuit to be applied to an oscillation circuit.

Further, the above-described semiconductor element is not necessarily by the semiconductor, and may further include a metallic material according occasions. For example, the semiconductor element such as a light receiving element may be implemented by at least one of Ag, Al, Au, In, Ga, N, Zn, Se, P, and As, and may be also implemented by using a semiconductor material doped by a p type or n type dopant or an intrinsic semiconductor material. Although the embodiments have been mainly described, they are simply exemplary and do not limit the present disclosure, and those skilled in the art to which the present disclosure pertains may understand that various modifications and applications may be made without departing from the essential characteristics of the embodiments. For example, the detailed elements of the embodiments may be modified. Further, it is construed that the differences related to the modifications and applications defined in the claims also fall within the scope of the present disclosure.

The light emitting package of the embodiment may improve corrosion by oxidation by providing protrusions of the first and second lead frames that are exposed to a side surface of the body to have a pad function of supplying a driving signal in an inspection process with the first layers.

Further, because the light emitting package of the embodiment has the cutaway areas at peripheries of the protrusions of the first and second lead frames exposed to a side surface of the body, the reliability of the inspection process may be improved by the conductive protrusions that are resistance to oxidation.

What is claimed is:

1. A light emitting package comprising:
   a first lead frame;
   a second lead frame spaced apart from the first lead frame in a first direction;
   a body coupled to the first lead frame and the second lead frame, the body having a first side surface and a second side surface disposed opposite to each other in the first direction, a third side surface and a fourth side surface disposed opposite to each other in a second direction that is perpendicular to the first direction, and a cavity having inner surfaces that are inclined around the light emitting element; and
   a light emitting element on the first lead frame,
   wherein the first lead frame comprises first to fourth side parts, the first side part comprises a first protrusion that protrudes outwards from the first side surface of the body, and a first contact part disposed at the end of the first protrusion,
   wherein the second lead frame comprises fifth to eighth side parts, the fifth side part comprises a second protrusion that protrudes outwards from the second side surface of the body, and a second contact part disposed at the end of the second protrusion,
   wherein each of the first contact part and the second contact part comprises a second layer and a first layer covering the second layer,
   wherein each of the first protrusion and the second protrusion includes different planes of the second layer which is exposed from the first layer,
   wherein the cavity includes a first bottom region that exposes the first lead frame and a second bottom region that exposes the second lead frame,
   wherein the light emitting element is disposed on the first bottom region,
   wherein the cavity includes a first recess recessed from the first bottom region toward the third side surface of the body and a second recess recessed from the first bottom region toward the second side surface of the body,
   wherein the second recess is connected to the second bottom region, and
   wherein an interval between the first and second recesses is larger than a length of a first side of the light emitting element.

2. The light emitting package of claim 1, wherein the first layer comprises a function to prevent oxidation.

3. The light emitting package of claim 1, wherein the first and second contact parts have widths of not less than 300 µm in the second direction that is perpendicular to the first direction,
   wherein the first side part comprises a first cutaway part and a second cutaway part that extend from the first protrusion, and the first protrusion is disposed on an outer side of the first cutaway part and the second cutaway part,
   wherein the first cutaway part extends from the first contact part toward the fourth side surface of the body,
   wherein the second cutaway part extends from the first contact toward the third side surface of the body,
   wherein each of the first cutaway part and the second cutaway part exposes a first surface of the first layer and a second surface of the second layer, and wherein the first surface of the first layer is disposed around the second surface of the second layer.

4. The light emitting package of claim 3, wherein the first cutaway part comprises a first inclined portion that extends from the first contact part and a first edge portion that extends from the first inclined portion,
 wherein the second cutaway part comprises a second inclined portion that extends from the second contact part and a second edge portion that extends from the second inclined portion,
 wherein the first inclined portion and the second inclined portion overlap in the second direction, and
 wherein the second surface of the second layer is formed of outer surfaces of the first inclined portion and the second inclined portion.

5. The light emitting package of claim 3, wherein a height of a step between the first contact part and the first cutaway part is 10 µm to 300 µm, and
 wherein a height of a step between the first contact part and the second cutaway part is 10 µm to 300 µm.

6. The light emitting package of claim 3, wherein each of the first cutaway part and the second cutaway part includes different planes of the second layer which is exposed from the first layer.

7. The light emitting package of claim 3, wherein the first cutaway part comprises a first bending portion that extends from the first contact part, and a first edge portion that extends from the first bending portion, and
 wherein the second cutaway part comprises a second bending portion that extends from the first contact part, and a second edge portion that extends from the second bending portion.

8. The light emitting package of claim 4, wherein the first and second cutaway parts are of a surface type, the first cutaway part is disposed between the first protrusion and the eighth side part, the second cutaway part is disposed between the first protrusion and the seventh side part.

9. The light emitting package of claim 8, wherein an angle between the first inclined portion and the first edge portion of the first cutaway part is greater than 90° and less than 180°, and
 wherein an angle between the second inclined portion and the second edge portion of the second cutaway part is greater than 90° and less than 180°.

10. The light emitting package of claim 4, wherein the first lead frame comprises third and fourth inclined portions at opposite ends of the second side part,
 wherein an angle between the third inclined portion and the second side part is greater than 90° and less than 180°,
 wherein an angle between the third inclined portion and the third side part is greater than 90° and less than 180°,
 wherein an angle between the fourth inclined portion and the second side part is greater than 90° and less than 180°,
 wherein an angle between the fourth inclined portion and the fourth side part is greater than 90° and less than 180°,
 wherein the third inclined portion and the fourth inclined portion overlap in the second direction,
 wherein the third inclined portion overlaps the second cutaway part in the first direction, and
 wherein the fourth inclined portion overlaps the first cutaway part in the first direction.

11. The light emitting package of claim 10, wherein the fifth side part comprises third and fourth cutaway parts that extend from the second protrusion, and the second protrusion is disposed on an outer side of each of the third and fourth cutaway parts,
 wherein the third cutaway part extends from the second contact part toward the fourth side surface of the body,
 wherein the fourth cutaway part extends from the first contact toward the third side surface of the body,
 wherein each of the third cutaway part and the fourth cutaway part exposes a third surface of the first layer and a fourth surface of the second layer, and
 wherein the third surface of the first layer is disposed around the fourth surface of the second layer.

12. The light emitting package of claim 11, wherein the third cutaway part comprises a fifth inclined portion that extends from the second contact part and a third edge portion that extends from the fifth inclined portion,
 wherein the fourth cutaway part comprises a sixth inclined portion that extends from the second contact part and a fourth edge portion that extends from the sixth inclined portion,
 wherein the fifth inclined portion and the sixth inclined portion overlap in the second direction, and
 wherein the fourth surface of the second layer is formed of outer surfaces of the third inclined portion and the fourth inclined portion.

13. The light emitting package of claim 11, wherein a height of a step between the second contact part and the third cutaway part is 10 µm to 300 µm, and
 wherein a height of a step between the second contact part and the fourth cutaway part is 10 µm to 300 µm.

14. The light emitting package of claim 11, wherein each of the third and fourth cutaway parts includes different planes of the second layer which is exposed from the first layer.

15. The light emitting package of claim 11, wherein the third cutaway part comprises a third bending portion that extends from the second contact part, and a fourth edge portion that extends from the third bending portion, and the fourth cutaway part comprises a fourth bending portion that extends from the second contact part, and a fourth edge portion that extends from the second bending portion.

16. The light emitting package of claim 11, wherein the third and fourth cutaway parts are of a surface type, the third cutaway part is disposed between the second protrusion and the eighth side part,
 wherein the fourth cutaway part is disposed between the second protrusion and the seventh side part.

17. The light emitting package of claim 16, wherein an angle between the fifth inclined portion and the third edge portion of the third cutaway part is greater than 90° and less than 180°, and
 wherein an angle between the sixth inclined portion and the fourth edge portion of the fourth cutaway part is greater than 90° and less than 180°.

18. The light emitting package of claim 11, wherein the second lead frame comprises seventh and eights inclined portions at opposite ends of the sixth side part,
 wherein an angle between the seventh inclined portion and the sixth side part is greater than 90° and less than 180°,
 wherein an angle between the seventh inclined portion and the seventh side part is greater than 90° and less than 180°,
 wherein an angle between the eighth inclined portion and the sixth side part is greater than 90° and less than 180°, and wherein an angle between the eighth inclined portion and the eighth side part is greater than 90° and less than 180°.

19. The light emitting package of claim 1, wherein each of the inner surfaces of the cavity face each side of the light emitting element on the first lead frame and have a constant distance from each side of the light emitting element.

20. A light emitting package comprising:
a first lead frame;
a second lead frame spaced apart from the first lead frame in a first direction;
a body coupled to the first lead frame and the second lead frame, the body having first and second side surfaces disposed opposite to each other in the first direction, third and fourth side surfaces disposed opposite to each other in a second direction that is perpendicular to the first direction, and a cavity having inner surfaces that are inclined around the light emitting element;
a light emitting element on the first lead frame; and
a protective element on the second lead frame,
wherein the first lead frame comprises first to fourth side parts, the first side part comprises a first protrusion that protrudes outwards from the first side surface of the body, and a first contact part disposed at the end of the first protrusion,
wherein the second lead frame comprises fifth to eighth side parts, the fifth side part comprises a second protrusion that protrudes outwards from the second side surface of the body, and a second contact part disposed at the end of the second protrusion,
wherein each of the first contact part and the second contact part comprises a second layer and a first layer covering the second layer,
wherein each of the first protrusion and the second protrusion includes different planes of the second layer which is exposed from the first layer,
wherein the cavity includes a first bottom region that exposes the first lead frame and a second bottom region that expose the second lead frame,
wherein the cavity includes a first recess recessed from the first bottom region toward the third side surface of the body and a second recess recessed from the first bottom region toward the second side surface of the body,
wherein the second recess is connected to the second bottom region,
wherein an interval between the first and second recesses is larger than a length of a first side of the light emitting element,
wherein the cavity includes a third bottom region that exposes the second lead frame,
wherein the light emitting element is disposed on the first bottom region,
wherein the protective element is disposed on the third bottom region, and
wherein the third bottom region is spaced from the first bottom region and second bottom region by one of the inner surfaces of the cavity.

* * * * *